(12) United States Patent
Müller

(10) Patent No.: US 10,460,788 B2
(45) Date of Patent: Oct. 29, 2019

(54) MEMORY CELL AND METHODS THEREOF

(71) Applicant: Ferroelectric Memory GmbH, Dresden (DE)

(72) Inventor: Stefan Müller, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 15/796,202

(22) Filed: Oct. 27, 2017

(65) Prior Publication Data

US 2019/0130957 A1   May 2, 2019

(51) Int. Cl.
| | |
|---|---|
| *H01L 29/76* | (2006.01) |
| *G11C 11/22* | (2006.01) |
| *H01L 29/78* | (2006.01) |
| *H01L 27/11585* | (2017.01) |
| *H01L 29/06* | (2006.01) |
| *H01L 29/51* | (2006.01) |

(Continued)

(52) U.S. Cl.
CPC ........ *G11C 11/2275* (2013.01); *G11C 11/221* (2013.01); *G11C 11/223* (2013.01); *G11C 11/2273* (2013.01); *G11C 16/04* (2013.01); *G11C 16/0408* (2013.01); *H01L 21/28291* (2013.01); *H01L 27/1159* (2013.01); *H01L 27/11585* (2013.01); *H01L 29/0673* (2013.01); *H01L 29/516* (2013.01); *H01L 29/785* (2013.01); *H01L 29/78391* (2014.09)

(58) Field of Classification Search
CPC ....................................................... H01L 29/76
USPC ....................................................... 257/395
See application file for complete search history.

(56) References Cited

U.S. PATENT DOCUMENTS

| | | |
|---|---|---|
| 7,709,359 B2 | 5/2010 | Boescke et al. |
| 8,304,823 B2 | 11/2012 | Boescke |

(Continued)

FOREIGN PATENT DOCUMENTS

| | | |
|---|---|---|
| CN | 106537509 A | 3/2017 |
| DE | 12008024519 B4 | 12/2009 |
| WO | WO 2001/071816 A1 | 9/2001 |

OTHER PUBLICATIONS

Tilke et al., "Highly Scalable Embedded Flash Memory With Deep Trench Isolation and Novel Buried Bitline Integration for the 90-nm Node and Beyond", IEEE, vol. 54 No. 7, dated Jul. 2007, 8 pages.

(Continued)

*Primary Examiner* — Jason Lappas
(74) *Attorney, Agent, or Firm* — Hickman Palermo Becker Bingham LLP; Malgorzata A. Kulczycka

(57) ABSTRACT

According to various embodiments, a memory cell may include: a channel region, a gate isolation structure disposed at the channel region; and a memory structure disposed over the gate isolation structure, the memory structure comprising a first electrode structure, a second electrode structure, and at least one remanent-polarizable layer disposed between the first electrode structure and the second electrode structure; wherein the first electrode structure, the gate isolation structure, and the channel region form a first capacitor structure defining a capacitor area of a first size; and wherein the first electrode structure, the at least one remanent-polarizable layer, and the second electrode structure form a second capacitor structure defining a capacitor area of a second size, wherein the second size is less than the first size.

17 Claims, 30 Drawing Sheets

(51) Int. Cl.
*G11C 16/04* (2006.01)
*H01L 21/28* (2006.01)
*H01L 27/1159* (2017.01)

(56) References Cited

U.S. PATENT DOCUMENTS

| | | |
|---|---|---|
| 9,053,802 B2 | 6/2015 | Muller et al. |
| 9,558,804 B2 | 1/2017 | Muller |
| 9,608,111 B2 | 3/2017 | Ramaswamy |
| 2001/0051436 A1 | 12/2001 | Kim |
| 2004/0129987 A1* | 7/2004 | Uchiyama ......... H01L 21/02197 257/395 |
| 2014/0254275 A1 | 9/2014 | Shuto |
| 2014/0355328 A1 | 12/2014 | Müller et al. |
| 2015/0340372 A1 | 11/2015 | Pandey et al. |
| 2016/0005961 A1 | 1/2016 | Ino |
| 2016/0268271 A1 | 9/2016 | Mueller et al. |
| 2017/0076775 A1 | 3/2017 | Muller |
| 2017/0154999 A1* | 6/2017 | Ramaswamy .... H01L 29/78391 |
| 2019/0129992 A1 | 5/2019 | Ewen |
| 2019/0130956 A1 | 5/2019 | Muller |

OTHER PUBLICATIONS

Shum et al., "Highly Scalable Flash Memory with Novel Deep Trench Isolation Embedded into High-Performance CMOS for the 90nm Node & beyond", dated 2005 IEEE, 4 pages.
Shum et al., "Highly Scalable Flash Memory Embedded into High-Performance CMOS for the 90nm Node & beyond", ICSICT_2006, Shanghai, China, 4 pages.
Muller, U.S. Appl. No. 15/796,154, filed Oct. 27, 2017, Office Action dated Feb. 21, 2019.

* cited by examiner

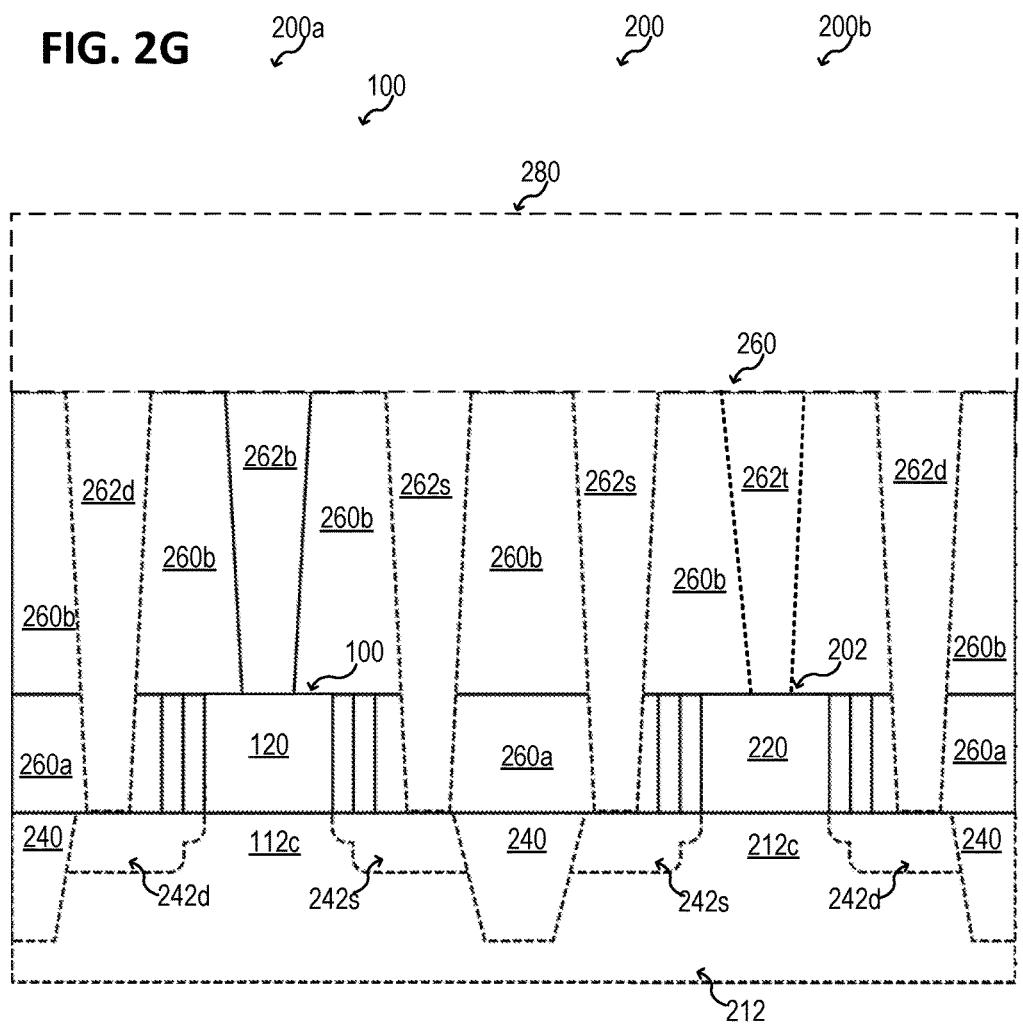
FIG. 2G
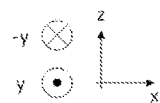

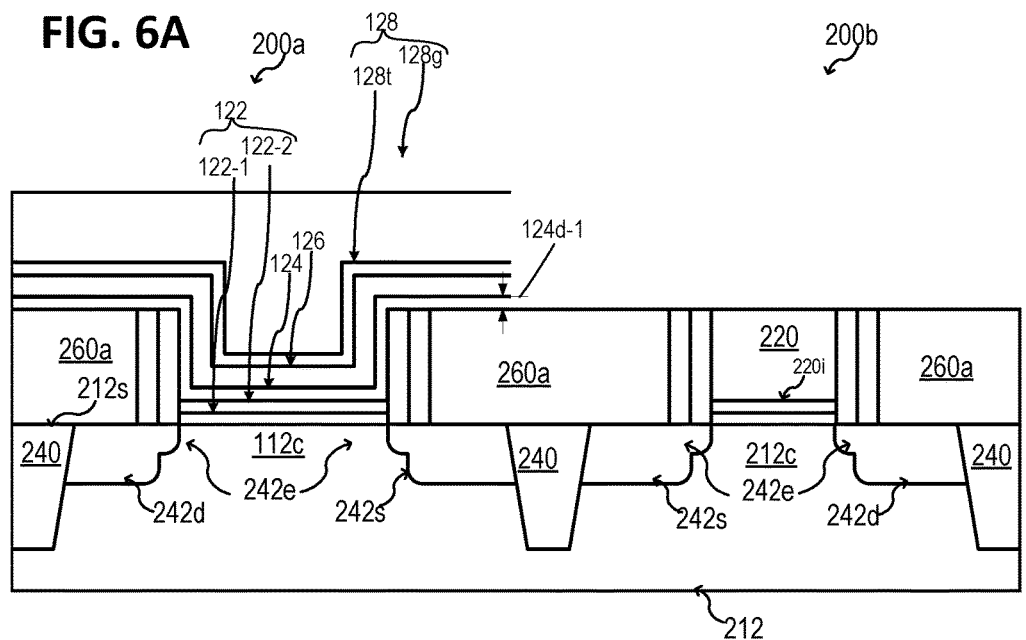
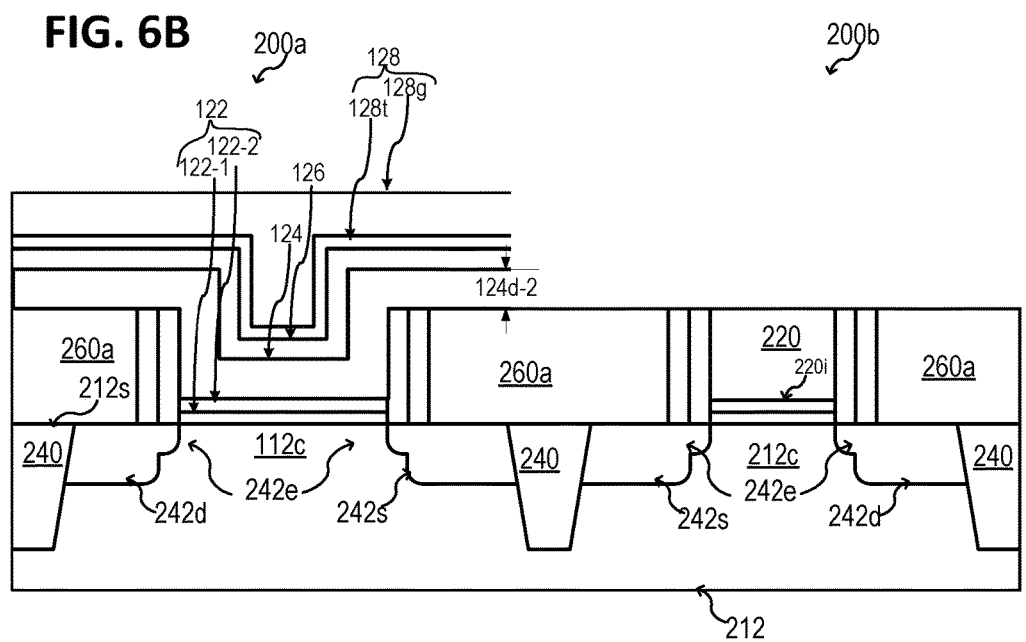

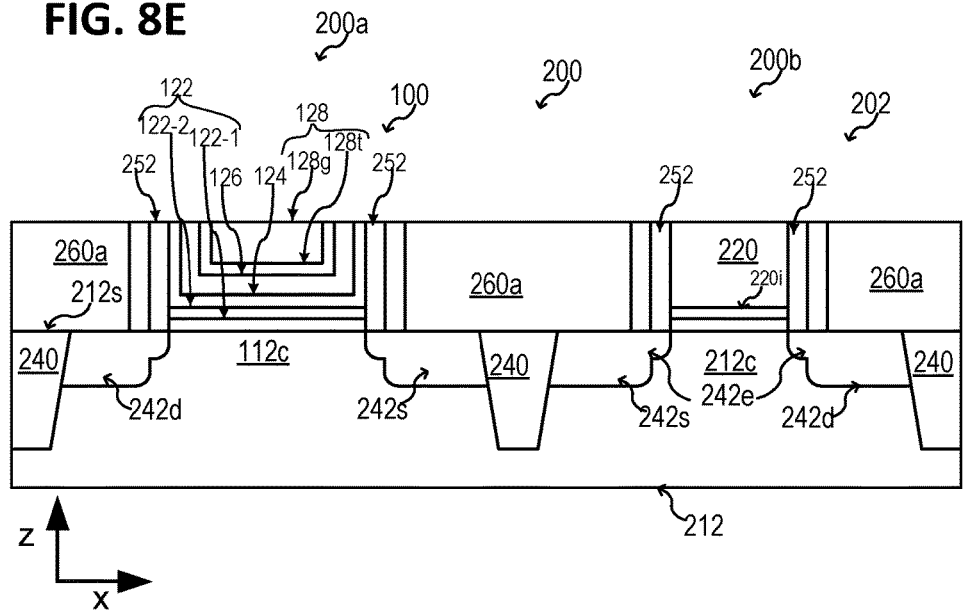
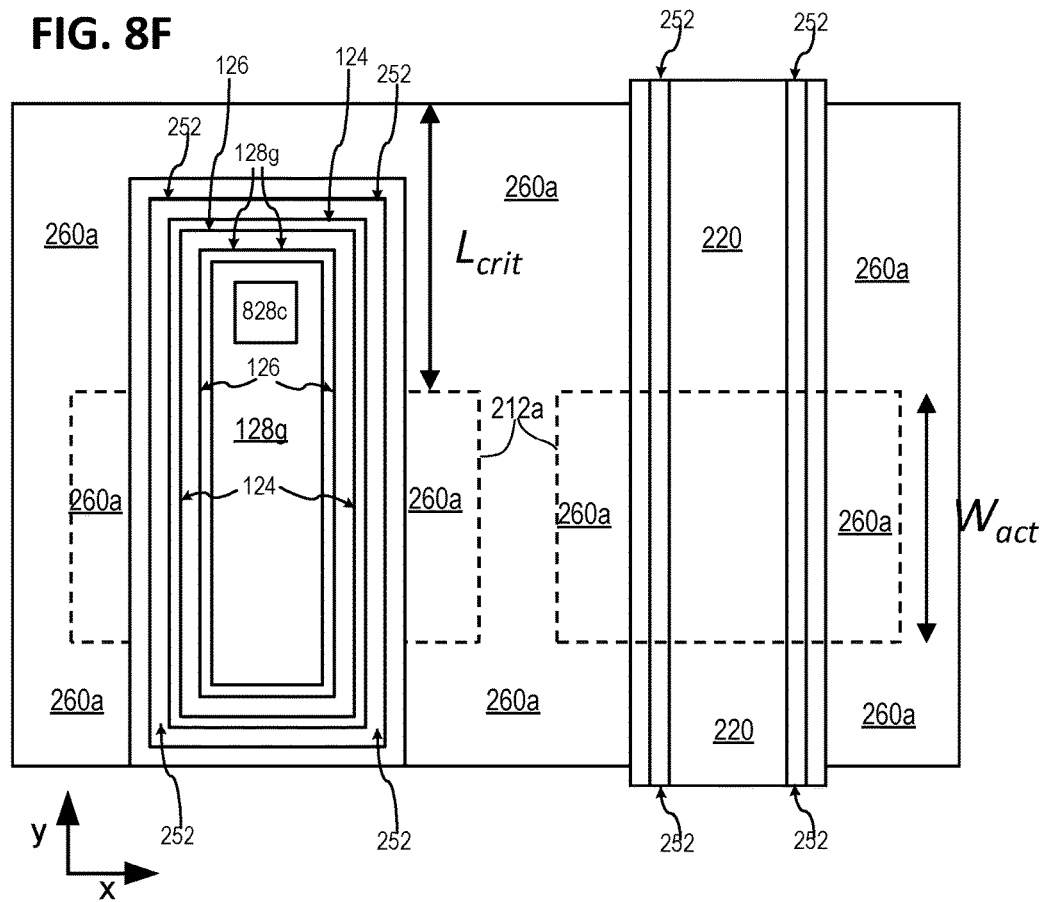

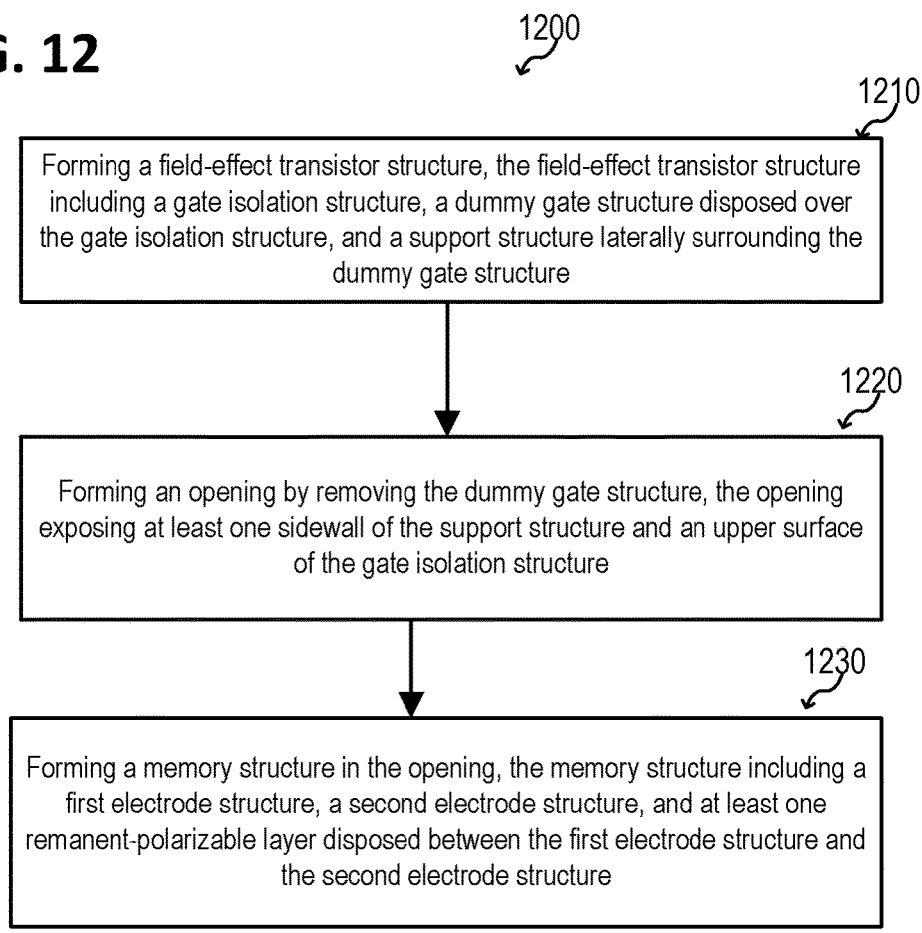

MEMORY CELL AND METHODS THEREOF

TECHNICAL FIELD

Various embodiments relate generally to a memory cell, an electronic device, and methods thereof, e.g., a method for processing a memory cell and a method for processing an electronic device.

BACKGROUND

In general, various computer memory technologies have been developed in semiconductor industry. A fundamental building block of a computer memory may be referred to as memory cell. The memory cell may be an electronic circuit that is configured to store at least one information (e.g., bitwise). As an example, the memory cell may have at least two states representing a logic 1 and a logic 0. The information may be maintained (stored) until the state of the memory cell is changed, e.g., in a controlled manner. The information stored in the memory cell may be read by determining the state of the memory cell. At present, various semiconductor process flows have been established to integrate various types of memory cells. The memory cells may be, for example, integrated on a wafer or a chip together with one or more logic circuits. In this case, the process flow for integrating the memory cell and the logic circuit may be adapted to manufacture both in an efficient way.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2F to FIG. 2H show a carrier during processing a memory cell or an electronic device including a memory cell in a schematic view, according to various embodiments;

FIG. 6A to FIG. 6D show a carrier during processing a memory cell or an electronic device including a memory cell in a schematic view, according to various embodiments;

FIG. 8A to FIG. 8F show various memory cells or various electronic devices in a schematic cross-sectional view and a corresponding top view, according to various embodiments;

FIG. 12 shows a schematic flow diagram of a method for processing a memory cell, according to various embodiments.

DESCRIPTION

Figure 1A:
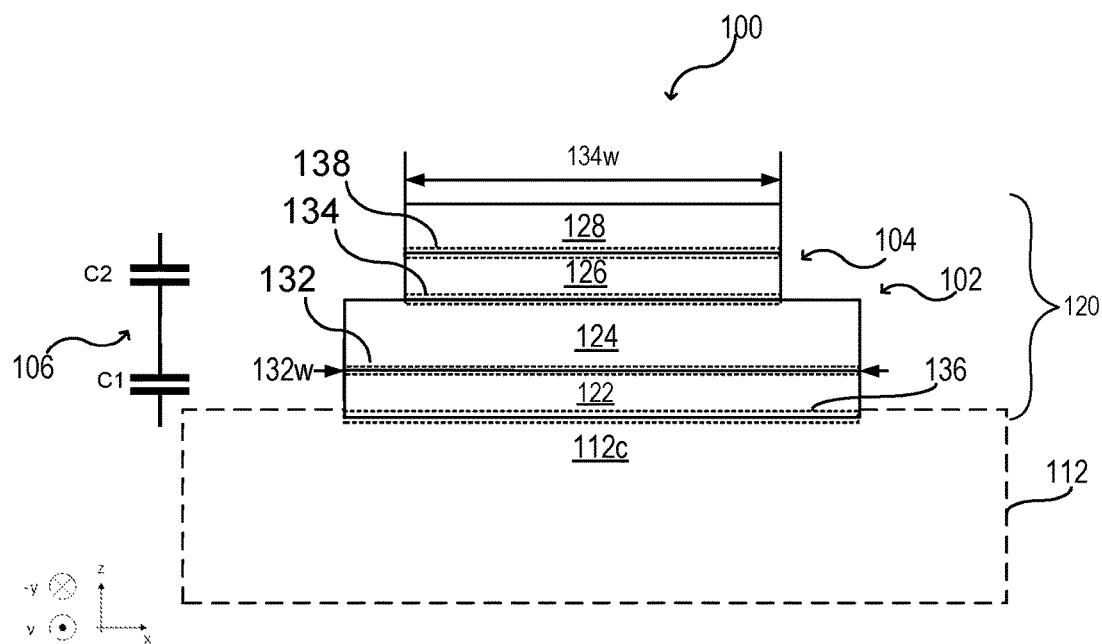
FIG. 1A shows a memory cell in a schematic view, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ ... ], etc. The term "a plurality" may be understood to include any integer number greater than or equal to two, i.e. two, three, four, five, [ ... ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The term "lateral" used with regards to a lateral dimension (in other words a lateral extent) of a structure, a portion, a structure element, a layer, etc., provided, for example, over and/or in a carrier (e.g. a layer, a substrate, a wafer, etc.) or "laterally" next to, may be used herein to mean an extent or a positional relationship along a surface of the carrier. That means that a surface of a carrier (e.g. a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. Further, the term "height" used with regards to a height of a structure, a portion, a structure element, a layer, etc., may be used herein to mean a dimension (in other words an extent) of a structure in a direction perpendicular to the surface of a carrier (e.g. perpendicular to the main processing surface of a carrier). The term "thickness" used with regards to a "thickness" of a layer may be used herein to mean the dimension (in other words an extent) of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer.

The term "conform" or "conformally" used with regards to a layer (e.g. a spacer layer, a liner layer, etc.) may be used herein to mean that the layer may have substantially the same thickness along an interface with another structure, e.g. the shape of a surface of a conformal layer may be substantially the same as the shape as of a surface of the underlying structure on which the layer is formed. According to various embodiments, layering processes such as plating or several chemical vapor processes (CVD), e.g. low pressure (LP)- (CVD), atomic layer deposition (ALD), etc., may be used to generate a conformal layer of a material. A conformal deposition process may allow covering sidewalls completely, e.g., even if the sidewall is aligned vertical to the surface of the carrier and/or parallel to the deposition direction. A sidewall may be, for example, generated by an opening (as for example a trench, a recess, a through hole, etc.) or by a structure element (as for example a fin, a protrusion, etc.).

The term region used with regards to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.) with only one doping type.

According to various embodiments, a semiconductor portion may be made of or may include silicon. However, other semiconductor materials of various types may be used in a similar way, e.g. germanium, Group III to V (e.g. SiC), or other types, including for example carbon nanotubes, organic materials (e.g., organic polymers), etc. In an embodiment, the semiconductor portion is a wafer made of silicon (e.g. p-type doped or n-type doped). In an alternative embodiment, the semiconductor portion is a silicon on insulator (SOI) wafer. In an alternative embodiment, the semiconductor portion may be provided by a semiconductor structure, e.g., by one or more semiconductor fins, one or more semiconductor fins one or more semiconductor nanosheets, one or more semiconductor nanowires, etc., disposed at a carrier.

In semiconductor industry, the integration of nonvolatile memory technologies (e.g., next to a processor core) may be useful for System-on-Chip (SoC) products like microcontrollers (MCU), etc. In the case that nonvolatile memory technologies are integrated on the same semiconductor chip as a logic circuit (e.g., next to a processor core), they may be referred to as embedded nonvolatile memories (eNVM). The eNVM market may be at present dominated by embedded Flash (eFlash), however, new emerging memories like magnetic RAM (MRAM), resistive RAM (RRAM), etc., may replace embedded Flash.

Further, another memory technology may be based on a ferroelectric field-effect transistor (FeFET). In this case, a memory cell may include a field-effect transistor (FET) having a ferroelectric material as a gate insulator. Since a ferroelectric material has two stable polarization states, it may be used to shift the threshold voltage of the field-effect transistor in a nonvolatile fashion; and, therefore, to turn the field-effect transistor, that usually loses its logic state, when power is removed, into a nonvolatile field-effect transistor that stores its state in a nonvolatile fashion, when power is removed.

In comparison to other emerging memory technologies, the FeFET memory cell may be in general integrated in the Front-End-of-Line (FEoL) and not in the Back-End-of-Line (BEoL) process flow, since it is a transistor-type of memory. Accordingly, the integration of the FeFET memory cell may comply with the standard FEoL complementary metal-oxide-semiconductor (CMOS) process flow. Consequently, various different integration schemes may be used for different process technologies, e.g., gate-first technologies, gate-last technologies, fully-depleted silicon-on-insulator (FDSOI) technologies, Fin-FET technologies, nanosheet technologies, nanowire technologies, etc. Those different process technologies may be, for example, relevant for technology nodes with a feature size equal to or less than 45 nm.

The integration of FeFET memory cells on advanced CMOS process platforms may be carried out in a gate-first process technology. However, FeFET memory cells may be implemented into other process technologies, wherein different integration schemes may be used. The FeFET memory cells may be integrated, for example, next to one or more logic circuit structures, e.g., next to one or more processor cores on a chip. However, the FeFET memory cells may be integrated independently from other structures.

According to various embodiments, various designs and integration schemes for a memory cell are provided. At least some of the designs and integration schemes may be exemplarily illustrated and described for specific technology, e.g., based on a gate-last process technology. However, the designs and integration schemes described herein may be used in the same or in a similar way for any other suitable process technology.

In the following, various designs and integration schemes for a memory cell are provided. The memory cell may be formed by suitable processes (usually layering, patterning, doping, thermal treatment, etc.) used in or compatible with semiconductor processing. According to various embodiments, atomic layer deposition (ALD) may be used as a layering process. According to various embodiments, atomic layer etching (ALE) and/or reactive ion etching (RIE) may be used in a patterning process, e.g., to partially or completely remove one or more layers, etc.

According to various embodiments, an electrode structure (e.g., one or more electrode structure of a memory cell, a gate electrode structure, etc.) may include an electrode material, which may be a conductor or a highly conducting (e.g., degenerately doped) semiconductor. The electrode structure may include for example at least one material of the following group of materials: titanium nitride (TiN), tantalum nitride (TaN), carbon (C), tungsten (W), platinum (Pt), copper (Cu), aluminum (Al), ruthenium (Ru), ruthenium oxide ($RuO_2$), iridium (Ir), iridium oxide ($IrO_2$), etc. However, any other suitable material may be used to form an electrode structure (e.g., one or more electrode layers, etc.). According to various embodiments, the electrode structure may be adapted (e.g., considering a chemical and/or mechanical stability) for $HfO_2$ (e.g., ferroelectric (FE) $HfO_2$) as an adjacent insulating material.

According to various embodiments, a Back-End-of-Line (BEoL) processing may be described herein as starting from the end of the Front-End-of-Line (FEoL) processing. In this case, FEoL processing may include all process steps until and including contact formation to the active area of a transistor. Illustratively, forming a contact metallization may be the last process of an FEoL processing and forming a single or multilevel metallization may be the first process of a BEoL processing. According to various embodiments, a single or multilevel metallization may be formed in a dual-damascene technique based on copper and/or aluminum; however, any other suitable process may be used to form the single or multilevel metallization.

According to various embodiments, BEoL processing may include forming one or more metallization structures (as part of a single or multilevel metallization). In this case, the one or more metallization structures may include, for example, any type of suitable wiring structures (e.g., within one or more metal and one or more via levels) including a metal (also referred to as BEoL metal). In this case, the metal may include for example copper (Cu), cobalt (Co), aluminum (Al), etc. However, any other suitable electrically conductive material may be used.

According to various embodiments, one or more contact structures (also referred to as contacts) may be used to electrically contact a semiconductor portion, an electrode structure, etc. In this case, any electrically conductive (e.g., metallic) material may be used that is suitable for forming an electrical contact. As an example tungsten (W), cobalt (Co), etc. may be used.

According to various embodiments, a ferroelectric material may be used as part of a memory structure. The ferroelectric material may be or may include ferroelectric $HfO_2$. Ferroelectric $HfO_2$ may include any form of hafnium oxide that may exhibit ferroelectric properties. This may include, for example, pure $HfO_2$, a solid solution of $HfO_2$ and $ZrO_2$ (e.g. but not limited to it a 1:1 mixture) or $HfO_2$ doped or substituted with one or more of the following elements (non-exhaustive list): silicon, aluminum, gadolinium, yttrium, lanthanum, strontium, zirconium, any of the rare earth elements or any other dopant (also referred to as doping agent) that is suitable to provide or maintain ferroelectricity in hafnium oxide.

According to various embodiments, a gate structure (e.g., including a gate isolation and a gate electrode) may be used as part of a field-effect transistor. A gate may be a main terminal of a field-effect transistor, e.g., in MOS technology. The material used to form the gate electrode may include, for example, highly doped polysilicon, aluminum, etc. However, any other suitable electrically conductive material may be used.

According to various embodiments, a high-k material may be used, e.g., within the gate isolation. A high-k (HK) material may include, for example, hafnium oxide ($HfO_2$), zirconium oxide ($ZrO_2$), lanthanum oxide ($La_2O_3$) and their doped/modified variants (e.g. doped with silicon) or any suitable insulator material that has a relative permittivity at least as high as silicon dioxide. According to various embodiments, the high-k material may also be replaced by a sacrificial layer (SL) or a combination of high-k material and sacrificial layer. Such a sacrificial layer may include, for example, TiN, TaN, or any other material that is stable in contact to its interfacing materials and has a substantial selectivity to the material e.g., during etching (e.g. polysilicon).

According to various embodiments, one or more field-effect transistor structures may be formed in a HK-last process flow. A HK-last process flow may include forming a dummy gate structure having a dummy gate isolation structure and a dummy gate electrode structure. Further, after the dummy gate isolation structure and the dummy gate electrode structure are removed, the actual a high-k material for the gate isolation structure and one or more materials (e.g., one or more metals) for the gate electrode structure may be deposited.

According to various embodiments, one or more field-effect transistor structures may be formed in a metal-last process flow. A metal-last process flow may include forming a dummy gate structure having a gate isolation structure and a dummy gate electrode structure. Further, after the dummy gate electrode structure is removed, the one or more materials (e.g., one or more metals) for the actual gate electrode structure may be deposited. In contrast to a HK-last process flow, the gate isolation structure (e.g., the high-k material) may remain (may not be substantially removed).

According to various embodiments, an electrical insulator may be or may include any suitable type of electrically non-conductive material or a material that has a substantially lower conductivity as compared to a metal. As an example, silicon nitride (SiN), silicon oxide ($SiO_2$), etc., may be used. According to various embodiments, a ferroelectric material is considered electrically insulating. An electrical insulator may be, in some aspects, also referred to as a dielectric material.

According to various embodiments, one or more patterning processes may be used to form a field-effect transistor structure and/or a memory structure, e.g., at least one of over or in a carrier. Therefore, a mask may be used. A mask may include a material that serves for transferring a photolithography mask pattern into one or more material layers. A mask may include, for example, a positive or negative photo resist (also referred to as soft mask) or a hard mask. The photo resist itself may be patterned by standard lithography processes. The patterning of the hard mask material may include a combination of photo resist patterning followed by etch of the hard mask material (e.g. wet or dry chemical etching). However, any other suitable process may be used to transfer a desired pattern into one or more material layers.

According to various embodiments, a high-k metal gate (HKMG) field-effect transistor structure may be used within a memory cell and/or as logic transistor. In this case, a metal-based gate electrode structure may be disposed over a high-k material as gate isolation. In this case, the gate electrode structure may include, for example, TiN, TaN, etc. However, one or more other metals or metallic materials may be used, e.g., for adjusting the work-function of a field-effect transistor structure. The gate electrode structure may include a material with one or more incorporated dopant species, as for example, lanthanum, aluminum, etc.

According to various embodiments, a metal-ferroelectric-metal-insulator-semiconductor (MFMIS) FeFET may be provided. In this case, a floating gate, i.e. a metal layer, may be disposed between the ferroelectric material and the gate isolation. In this case, the gate of the transistor may be connected in series to a ferroelectric capacitor.

According to various embodiments, (e.g., highly) doped silicon may be used. In this case, donator (e.g. phosphorous) and/or acceptor (e.g. boron) doping may be used for doping the silicon. Silicon may be used in a single crystalline or polycrystalline microstructure.

According to various embodiments, at least one spacer (also referred to as sidewall spacer or spacer structure) may be used. In this case, a (e.g., electrically insulating) material may be utilized for covering and/or protecting one or more sidewalls of certain structures (e.g., of a gate structure, a memory structure, etc.). The material may be for example silicon nitride (SiN), silicon oxide ($SiO_2$), etc. However, any other material may be used that allows a conformal deposition for providing the spacer.

According to various embodiments, a shallow trench isolation (STI) may be used to separate adjacent field-effect transistor structures and/or to separate a memory cell from an adjacent field-effect transistor structure.

In the following, various integration schemes and memory cell designs are provided, wherein a memory structure is disposed within a field-effect transistor structure or, in other words, wherein a memory field-effect transistor structure is formed at least one of over or in a carrier. Various embodiments may include an integration of a memory cell in which the functional memory layer (e.g., one or more remanent-polarizable layers, one or more ferroelectric layers, etc.) may be disposed within a field-effect transistor structure, e.g., between a gate and a floating gate of the field-effect transistor structure. In this case, the memory state may be still encoded in the threshold voltage of the field-effect transistor. According to various embodiments, the memory cell may be a one-transistor (1T) cell that may be integrated efficiently into any desired process flow.

Various embodiments are related to a remanently polarizable layer as memory layer or as a functional part of a memory structure. In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material, when the electric field is reduced to zero, may be referred to as remanent polarization. Therefore, the remanence of a material may be a measure of the residual polarization in the material in the case that an applied electric field is removed. In general, ferroelectricity and anti-ferroelectricity may be concepts to describe a remanent polarization of a material similar to ferromagnetism and anti-ferromagnetism used to described remanent magnetization in magnetic materials.

Further, the term spontaneously polarized or spontaneous polarization may be used with reference to a residual polarization. The coercivity of a material may be a measure of the strength of the reverse polarizing electric field that may be required to remove a remanent polarization. A remanent polarization may be evaluated via analyzing one or more hysteresis measurements (e.g., hysteresis curves), e.g., in a plot of P versus E, in which the material is polarized into opposite directions. A remanent polarization may be analyzed using capacity spectroscopy, e.g., via a static (C-V) and/or time-resolved measurement or by polarization-voltage (P-V) or positive-up-negative-down (PUND) measurements.

FIG. 1A illustrates a memory cell 100 in a schematic view, according to various embodiments. The memory cell 100 may include a channel region 112c and a gate isolation structure 122 disposed over the channel region 112c. Further, a first electrode structure 124 may be disposed over the gate isolation structure 122. Further, at least one remanent-polarizable layer 126 may be disposed over the first electrode structure 124. Further, a second electrode structure 128 may be disposed over the at least one remanent-polarizable layer 126.

Illustratively, the channel region 112c, the gate isolation structure 122, the first electrode structure 124, the at least one remanent-polarizable layer 126, and the second electrode structure 128 form a field-effect transistor structure having at least one remanent-polarizable layer 126 as memory layer, wherein the first electrode structure 124 may be configured as a floating gate and wherein the second electrode structure 128 may be configured as a gate. Illustratively, the first electrode structure 124, the at least one remanent-polarizable layer 126, and the second electrode structure 128 may form a memory structure 104 (e.g., a ferroelectric capacitor, also referred to as FeCap, see FIG. 1B). Illustratively, the channel region 112c, the gate isolation structure 122, and the first electrode structure 124 may form a field-effect transistor structure 102 (e.g., a metal-insulator-semiconductor (MIS) layer stack.

According to various embodiments, a first lateral interface 132 between the gate isolation structure 122 and the first electrode structure 124 may have a first lateral dimension 132w. Further, a second lateral interface 134 between the at least one remanent-polarizable layer 126 and the first electrode structure 124 has a second lateral dimension 134w less than the first lateral dimension 132w. Illustratively, the electronic properties of the memory cell 100 may be influenced by adapting the lateral dimensions (and therefore the size) of the lateral interfaces 132, 134 as described in more detail below.

According to various embodiments, the first electrode structure 124, the gate isolation structure 122, and the channel region 112c of the memory cell 100 may form a first capacitor structure C1. The first capacitor structure C1 may be a metal-insulator-semiconductor (MIS) layer stack, see FIG. 1B. Further, the first electrode structure 124, the at least one remanent-polarizable layer 126, and the second electrode structure 128 may form a second capacitor structure C2. The second capacitor structure C2 may be a metal-ferroelectric-metal (MFM) layer stack, also referred to as ferroelectric capacitor (FeCap), see, for example, FIG. 1B. According to various embodiments, the first capacitor structure C1 may define a capacitor area of a first size; and the second capacitor structure C2 may define a capacitor area of a second size less than the first size.

Further, according to various embodiments, a third lateral interface 136 between the gate isolation structure 122 and the channel region 112c may have a third lateral dimension. The second lateral dimension 134w of the second lateral interface 134 may be less than the third lateral dimension of the third lateral interface 136. The third lateral dimension of the third lateral interface 136 may be, according to various embodiments, substantially equal to the first lateral dimension 132w of the first lateral interface 132 (e.g., with a deviation of less than about 20%, e.g., less than about 10%). Alternatively, the third lateral dimension of the third lateral interface 136 may be greater than the first lateral dimension 132w of the first lateral interface 132.

Further, according to various embodiments, a fourth lateral interface 138 between the at least one remanent-polarizable layer 126 and the second electrode structure 128 may have a fourth lateral dimension. The fourth lateral dimension of the fourth lateral interface 138 may be less than the first lateral dimension 132w of the first interface 132. The fourth lateral dimension of the fourth lateral interface 138 may be, according to various embodiments, substantially equal to the second lateral dimension 134w of the second interface 134 (e.g., with a deviation of less than about 20%, e.g., less than about 10%). Alternatively, the fourth lateral dimension of the fourth lateral interface 138 may be less than the second lateral dimension 134w of the second interface 134.

The respective lateral dimension of the interfaces 132, 134, 136, 138 may be determined, for comparison, with respect to the same lateral direction, e.g., with respect to the x-axis, as illustrated in FIG. 1A, the y-axis, and/or any other lateral direction within the x-y-plane perpendicular to the z-axis.

According to various embodiments, the gate isolation structure 122 may define the channel region 112c in a semiconductor portion 112. The memory cell 100 may be configured, in various embodiments, as a planar structure (e.g., with a planar gate isolation structure 122 covering a planar channel region 112c). The semiconductor portion 112 may be part of a semiconductor wafer, a semiconductor layer (e.g., an epitaxial semiconductor layer), etc.; however, the semiconductor portion 112 may be provided by any suitable material in any suitable shape. In various embodiments, silicon may be used as semiconductor material; however, any other semiconductor material may be used in the same or in a similar way.

According to various embodiments, the first electrode structure 124 may include one or more electrically conductive layers. The gate electrode structure 124 may include, for example, one or more metal layers, one or more electrically conductive polysilicon layers, etc.

According to various embodiments, the gate isolation structure 122 may include any suitable single layer or layer stack that allows an electrical separation of the first electrode structure 124 from the channel region 112c and further to influence the channel region 112c via an electric field generated by the first electrode structure 124. The gate isolation structure 122 may include, for example, one or more high-k material layers, a layer stack including one or more high-k material layers disposed over one or more electrically insulating layers, a single electrically insulating layer or a layer stack including two or more electrically insulating layers, etc.

According to various embodiments, the at least one remanent-polarizable layer 126 may include any type of remanent-polarizable and/or spontaneously-polarizable material, e.g., a ferroelectric material, an anti-ferroelectric material, an anti-ferroelectric-like material, etc. The at least one remanent-polarizable layer 126 may be the functional layer of the memory structure 104 (illustratively of the memory cell 100) to store, for example, an information via at least two remanent polarization states of the at least one remanent-polarizable layer 126. The programming of the memory structure 104 (illustratively the storage of information in the memory cell 100) may be carried out by providing an electric field between the first electrode structure 124 and the second electrode structure 128 to thereby set or change the remanent polarization state of the at least one remanent-polarizable layer 126. The electric field between the first electrode structure 124 and the second electrode structure 128 may be provided by a potential difference between the channel region 112c and the second electrode structure 128. As an example, a voltage (i.e. the potential difference) may be applied between the top electrode 128 and the bulk, S/D region 112. As a result, a potential difference is generated between the bottom electrode 124 and the top electrode 128, since may be no terminal that contacts the floating gate.

As illustrated in FIG. 1A, the memory cell 100 may be configured as a capacitive voltage divider 106. As an example, the channel region 112c, the gate isolation structure 122, and the first electrode structure 124 may form a first capacitor C1 of the capacitive voltage divider 106 and the first electrode structure 124, the at least one remanent-polarizable layer 126, and the second electrode structure 128 may form a second capacitor C2 of the capacitive voltage divider 106 coupled in series with the first capacitor C1. This configuration may allow adapting the capacitance of the respective capacitors C1, C2 to allow an efficient programming of the memory cell 100, as described in more detail below. As an example, the memory cell 100 may be configured to provide the second capacitor C2 with a lower capacitance than the first capacitor C1. This may be achieved for example by providing the second interface 134 with a lateral dimension 134w that is less than the lateral dimension 132w of the first interface 132.

The overall gate voltage required for switching the memory cell 100 from one state into the other (e.g. from high threshold voltage state to low threshold voltage state), i.e. for flipping a ferroelectric dipole from, for example, "up" to "down" or "down" to "up", may become smaller since more of the applied gate voltage drops across at least one remanent-polarizable layer 126 than across the gate isolation structure 122. The voltage distribution may be determined by voltage divider calculations for a series connection of the capacitors C1, C2. That is, if the capacitance of the second capacitor C2 is reduced (e.g., by reducing the capacitor area or by reducing the lateral dimension 134w of the second interface 134), a higher fraction of the voltage applied to the series connection drops across the second capacitor C2. Accordingly, the electric field generated across the gate isolation structure 122 reduces because the voltage drop across this structure is reduced. This leads to a reduced interfacial field stress, which may lead to a reduced wear out of the interface due to, for example, charge injection. Therefore, the reduced electric field generated across the gate isolation structure 122 may lead to improved endurance characteristics of the memory cell 100, that is, to an increased amount of possible polarization reversals until the memory cell 100 may lose its memory properties.

By reducing the capacitor area of the second capacitor C2 (e.g., by reducing the lateral dimension), the depolarization field, $E_{Dep}$, of the at least one remanent-polarizable layer 126 may be reduced. The depolarization field may be expressed by the following set of equations, wherein the indices "FE" refer to the second capacitor C2 (also referred to as $C_{FeCap}$) and the indices "IS" refer to the first capacitor C1 (also referred to $C_{MIS}$), as described herein:

$$V_{FE} + V_{IS} = 0,$$

$$D = \varepsilon_0 \varepsilon_{IS} E_{IS} = \varepsilon_0 \varepsilon_{FE} E_{FE} + P,$$

$$E_{FE} \equiv E_{Dep} = -P\left(\varepsilon_0 \varepsilon_{FE}\left(\frac{C_{IS}}{C_{FE}} + 1\right)\right)^{-1}$$

The depolarization field $E_{Dep}$ may be detrimental to data retention since it may depend on its magnitude that depolarizes the at least one remanent-polarizable layer 126. However, the magnitude may be reduced by increasing the capacitance ratio $C_{IS}/C_{FE}$ (illustratively C1/C2). Accordingly, when the area of the second capacitor C2 is reduced, its overall capacitance is reduced and hence, the depolarization field is reduced. This in turn improves the data retention of the memory cell 100.

Figure 1B:
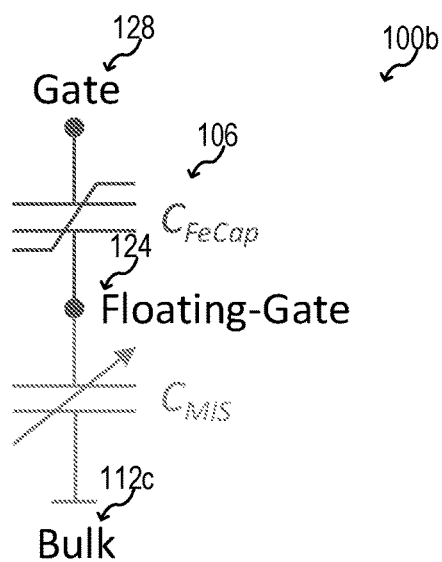
FIG. 1B shows an equivalent circuit of a memory cell in a schematic view, according to various embodiments.

FIG. 1B illustrates a schematic equivalent circuit 100b of the capacitive voltage divider 106 of a memory cell 100, according to various embodiments. In order to reduce the write voltage and increase endurance as well as retention of memory cell 100, it may be desirable to adjust the capacitive voltage divider, as described above.

As an example, the memory cell 100 may be illustrated by a series connection of a ferroelectric capacitor (e.g., metal-ferroelectric-metal (MFM) capacitor) and the variable capacitance of the remaining layer stack (e.g., metal-insulator-semiconductor (MIS) layer stack).

In a first approximation, the voltage which drops across the ferroelectric capacitor ($V_{FeCap}$) may be estimated by:

$$V_{FeCap} = V_{Gate} \cdot \frac{C_{MIS}}{C_{MIS} + C_{FeCap}}$$

wherein $V_{Gate}$ may represent the voltage applied to the gate (e.g., to the second electrode structure 128) and the capacitances in general may be defined as:

$$C = \varepsilon_0 \varepsilon_r \frac{A}{d}$$

with $\varepsilon_0$ and $\varepsilon_r$ being the vacuum and relative permittivity and A and d the area and the thickness of the capacitors respectively.

Assuming that $\varepsilon_r$ may only be modified in very limited range since it is a material constant and furthermore assuming that variations of the film thicknesses d of the capacitors may be limited (e.g., due to write voltage and leakage current restrictions), a suitable parameter for influencing the voltage drop across the ferroelectric capacitor may be represented by the area of the capacitors and their relative proportion.

As an example, assuming both $\varepsilon_r$ and d may be identical for both of the ferroelectric capacitor and the remaining layer stack, the capacitive voltage drop for an area ratio of 1:3 becomes:

$$V_{FeCap} = V_{Gate} \cdot \frac{C_{MIS}}{C_{MIS} + C_{FeCap}} \stackrel{3 \cdot A_{FeCap} = A_{MIS}}{=} V_{Gate} \cdot \frac{3}{4} = 0.75\% \cdot V_{Gate}$$

Accordingly, modifying the area ratio of the capacitors may allow improving the memory cell 100 performance (the write voltage, the endurance, the retention, etc.). The dimensions of the respective capacitors may be defined by their projections of the respective electrodes onto each other. For the ferroelectric capacitor (FeCap) it may be the projection of the top electrode (e.g., the second electrode structure 128) onto the bottom electrode (e.g., the first electrode structure 124), and for the MIS layer stack (CMIS) it may be the projection of the floating gate (e.g., the first electrode structure 124) onto the active area of the device (e.g., the channel region 112c) that defines the actual capacitor area.

According to various embodiments, a ratio of the capacitor area of the ferroelectric capacitor C2 to the capacitor area of the MIS layer stack C1 may be selected between 1 and 0, e.g., in the range from about 0.5 to about 0.1, e.g., 0.25 (i.e. 1:4, that is, 4 times larger MIS area than FeCap area).

Figure 1C:
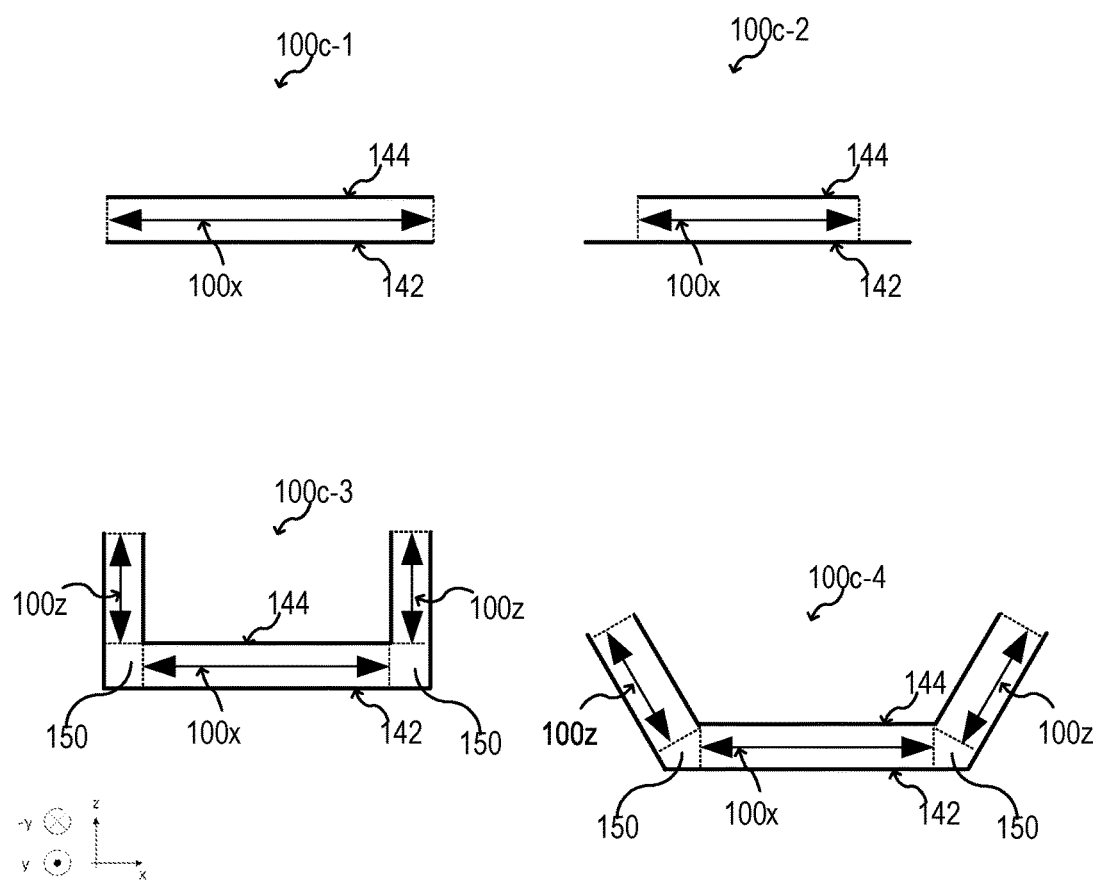
FIG. 1C shows various capacitor structures in a schematic view, according to various embodiments.

In FIG. 1C, capacitor area contributions are illustrated for the various capacitor structures 100c-1, 100c-2, 100c-3, 100c-4. The respective capacitor structures 100c-1, 100c-2, 100c-3, 100c-4 are illustrated based on a pair of electrodes (142) and (144), e.g., a top electrode 144 and a bottom electrode 142) associated with one another.

Planar capacitor structures 100c-1, 100c-2 may have an x-contribution 100x associated with the (lateral) dimension of the capacitor structures 100c-1, 100c-2 in x-direction, and (out of plane) an y-contribution associated with the (lateral) dimension of the capacitor structures 100c-1, 100c-2 in y-direction perpendicular to the x-direction. The x-y-plane may be aligned with the main processing surface of the carrier on which the capacitor structures 100c-1, 100c-2 are formed. The capacitor structure 100c-2 may have a reduced x-contribution 100x compared to the capacitor structure 100c-1 since the top electrode 144 has a reduced width, see FIG. 1A.

Non-planar (e.g., 3D-) capacitor structures 100c-3, 100c-4 may have an x-contribution 100x associated with the (lateral) dimension of the capacitor structures 100c, 100d in x-direction, (out of plane) an y-contribution associated with the (lateral) dimension of the capacitor structures 100c-3, 100c-4 in y-direction perpendicular to the x-direction, and a z-contribution associated with the (vertical) dimension of the capacitor structures 100c-3, 100c-4 in z-direction perpendicular to the x- and y-directions. According to various embodiments, the effective area of the capacitor structures 100c-1, 100c-2, 100c-3, 100c-4 may be geometrically determined.

According to various embodiments, the first electrode structure 124 may include titanium nitride and may have a thickness in the range from about 1 nm to about 15 nm, e.g. a thickness of about 8 nm. According to various embodiments, the at least one remanent-polarizable layer 126 may include ferroelectric $HfO_2$, e.g. $Hf_xZr_{1-x}O_2$ (e.g., with x=0.5) and may have a thickness in the range from about 2 nm to about 40 nm, e.g., in the range from about 2 nm to about 10 nm, e.g., a thickness of about 10 nm. According to various embodiments, the second electrode structure 128 may include titanium nitride and may have a thickness in the range from about 1 nm to about 15 nm, e.g. a thickness of about 8 nm.

According to various embodiments, the gate isolation structure 122 may include a single gate isolation layer or a layer stack including a first gate isolation layer and a second gate isolation layer disposed over the first gate isolation layer. As an example, the first gate isolation layer of the layer stack may include an electrically insulating material, e.g., silicon oxide ($SiO_2$), and may have a thickness in the range from about 0.5 nm to about 5 nm, e.g. a thickness of about 1 nm. The second gate isolation layer of the layer stack may include a high-k material, e.g. $HfO_2$, and may have a thickness in the range from about 0.5 nm to about 5 nm, e.g. a thickness of about 1.5 nm. The first gate isolation layer of the layer stack may be disposed directly on the channel region and may provide an interface for forming the second gate isolation layer. However, other suitable materials and designs may be used as gate isolation structure 122, e.g., a single silicon oxide layer, an ONO-(silicon oxide/silicon nitride/silicon oxide)-layer stack, etc.

As illustrated, for example, in FIG. 1A, the memory cell 100 may include a memory gate structure 120 (also referred to as memory gate stack or FeFET stack) disposed over the channel region 112c, the memory gate structure 120 may include the gate isolation structure 122, the first electrode structure 124, the at least one remanent-polarizable layer 126, and the second electrode structure 128, as described herein.

Various exemplary modifications and/or configurations of the memory cell 100 are described in more detail below. The memory cell 100 may be, for example, integrated on a carrier (e.g., a semiconductor wafer, etc.) side-by-side with one or more logic cells, as described in the following based on various integration schemes. However, the memory cell 100 may be integrated in a similar way with any another integrated circuit structure or micro-mechanical structure. Further, the memory cell 100 may be integrated in a similar way solely.

FIGS. 2A to 2G illustrate a carrier 212 during processing, e.g., during processing (e.g., manufacturing) a memory cell 100 or an electronic device 200, according to various embodiments. The carrier 212 may be a semiconductor die, a semiconductor wafer, a semiconductor portion, etc. Further, a memory area 200a and a logic area 200b may be associated with the carrier 212. One or more memory cells 100 may be disposed (e.g., formed) in the memory area 200a. Each of the one or more memory cells 100 may include a field-effect transistor structure 102 and a memory structure 104, as described herein. Further, one or more logic transistor structures 202 (e.g., one or more field-effect transistor structures) may be disposed (e.g., formed) in the logic area 200b. The logic transistor structures 202 disposed in the logic area 200b are illustrated and described herein exemplarily as field-effect transistor structures 202. However, any other suitable type of transistor may be formed in the logic area 200b.

Figure 2A:
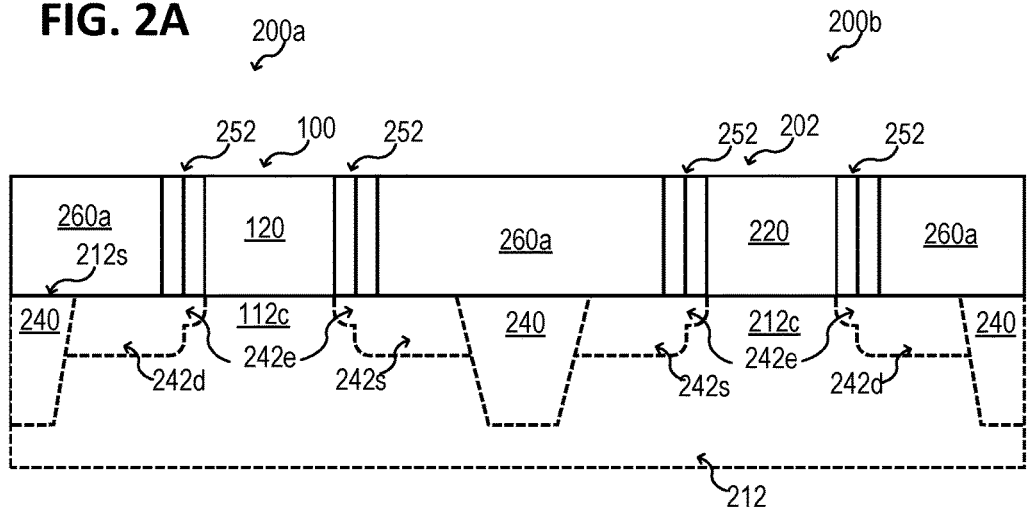
FIG. 2A shows a carrier during processing a memory cell or an electronic device including a memory cell in a schematic view, according to various embodiments.
Figure 2B:
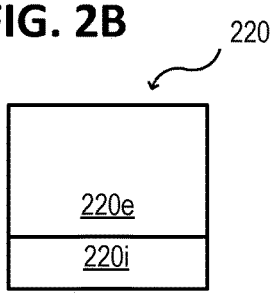
FIG. 2B to FIG. 2E show a gate structure of a field-effect transistor structure in a schematic view, according to various embodiments.

FIG. 2A shows the carrier 212 in a schematic cross-sectional view at an initial processing stage, according to various embodiments. A memory cell 100 may be formed in the memory area 200a of the carrier 212 and a logic field-effect transistor 202 may be formed in the logic area 200b of the carrier 212.

The memory cell 100 in the memory area 200a may include a first channel region 112c disposed in the carrier 212 and a memory gate structure 120 disposed at the first channel region 112c. The logic field-effect transistor 202 in the logic area 200b may include a second channel region 212c disposed in the carrier 212 and a logic gate structure 220 (also referred to as logic gate stack or field-effect transistor gate stack) disposed at the second channel region 212c.

Further, both the memory cell 100 and the logic field-effect transistor 202 may include at least two corresponding source/drain regions 242d, 242s. The respective channel regions 112c, 212c may be disposed between the corresponding source/drain regions 242d, 242s. According to various embodiments, at least two source/drain regions 242d, 242s may be associated with the memory cell 100 and with the logic field-effect transistor 202, wherein one may be used as a source and the other one may be used as a drain for operating the memory cell 100 and the logic field-effect transistor 202. The source/drain regions 242d, 242d may include source/drain extensions 242e. The carrier 212 may have a main processing surface 212s. The respective gate structures 120, 220 may be disposed above (e.g., directly on) the main processing surface 212s. According to various embodiments, the source, drain and the respective extension regions may be modified as desired, e.g., the source, drain and the respective extension regions in the memory area 200a may be different from the source, drain and the respective extension regions in the logic area 200b.

FIG. 2B to FIG. 2E show various designs for a logic gate structure 220 in schematic cross-sectional views, according to various embodiments. The logic gate structure 220 may include a gate electrode structure 220e and a gate isolation structure 220i. The gate isolation structure 220i may be disposed between the gate electrode structure 220e and the channel region 212c.

According to various embodiments, the gate electrode structure 220e may include a first metal layer (e.g., a liner layer) 220e-1 and a second metal layer 220e-2 disposed over the first metal layer. As an example, the first metal layer 220e-1 may include an electrically conductive liner material, e.g., titanium nitride, etc., and may have a thickness in the range from about 0.5 nm to about 5 nm, e.g. a thickness of about 2 nm. Further, the second metal layer 220e-2 may include, for example, aluminum. However, other suitable materials and designs may be used as gate electrode structure 220e, e.g., polysilicon.

According to various embodiments, the gate isolation structure 220 may include a first gate isolation layer 220i-1 and a second gate isolation layer 220i-2 disposed over the first gate isolation layer 220i-1. As an example, the first gate isolation layer 220i-1 may include an electrically insulating material, e.g., silicon oxide ($SiO_2$), and may have a thickness in the range from about 0.5 nm to about 5 nm, e.g. a thickness of about 1 nm. The second gate isolation layer 220i-2 may include a high-k material, e.g. $HfO_2$, and may have a thickness in the range from about 0.5 nm to about 5 nm, e.g. a thickness of about 1.5 nm. The first gate isolation layer 220i-1 may be disposed directly on the channel region and may provide an interface for forming the second gate isolation layer 220i-2. However, other suitable materials and designs may be used as gate isolation structure 220, e.g., a single silicon oxide layer, an ONO-(silicon oxide/silicon nitride/silicon oxide)-layer stack, etc. According to various embodiments, one of the gate isolation layers 122i-1, 122i-2 may be optional.

Figure 2C:
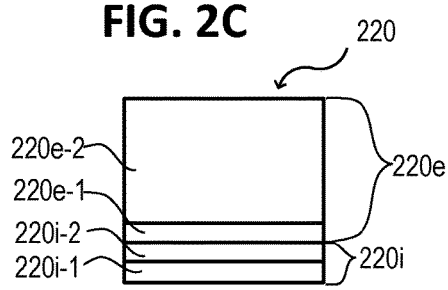
Figure 2D:
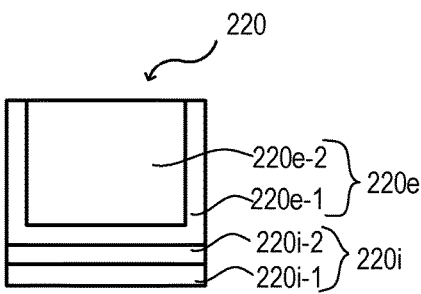
Figure 2E:
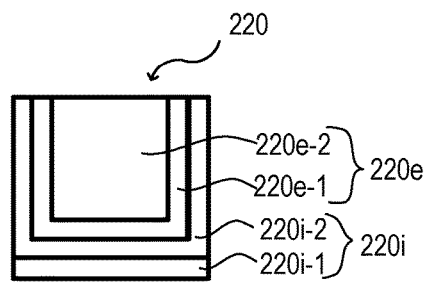

As an example, FIG. 2C shows a logic gate structure 220 formed via a gate first process flow, FIG. 2D shows a logic gate structure 220 formed via a metal last process flow, and FIG. 2E shows a logic gate structure 220 formed via a high-k last process flow. According to various embodiments, the gate isolation structure 122 of the memory cell 100 and the gate isolation structure 220 of the logic field-effect transistor 202 may be formed in a single process flow at the same time.

According to various embodiments, the memory gate structure 120 and the logic gate structure 220 may be formed between one or more spacer structures 252, e.g., between two single or two pairs of spacers including, for example, silicon nitride (SiN), silicon oxide ($SiO_2$), etc. having a width in the range from about 0.5 nm to about 5 nm, e.g., a width of 3 nm. The one or more spacer structures 252 may be used for forming (e.g., doping via ion implantation, etc.) the source/drain regions 242d, 242s and/or the source/drain extensions 242e. The one or more spacer structures 252 may be formed by one or more conformal deposition processes (e.g., using ALD) and one or more anisotropic etch processes (e.g., using RIE).

The source/drain regions 242d, 242s and/or the source/drain extensions 242e may include, for example in an NFET configuration, phosphorous (P) or arsenic (As) doped silicon, or, for example in a PFET configuration, boron (N) doped silicon. The doped silicon may be doped to have a dopant concentration in the range from about $10^{17}$ cm$^{-3}$ to about $10^{21}$ cm$^{-3}$, e.g. about $10^{18}$ cm$^{-3}$.

According to various embodiments, the first channel region 112c of the memory area 200a and the second channel region 212c of the logic area 200b may be separated by at least one isolation structure 240, e.g., by an STI.

According to various embodiments, the gate structures 220 may be embedded in (e.g., may be laterally surrounded by) a first insulator layer 260a. The first insulator layer 260a may include a dielectric material, e.g., silicon oxide (SiO$_2$), silicon nitride (SiN$_x$), etc.

Figure 2F:
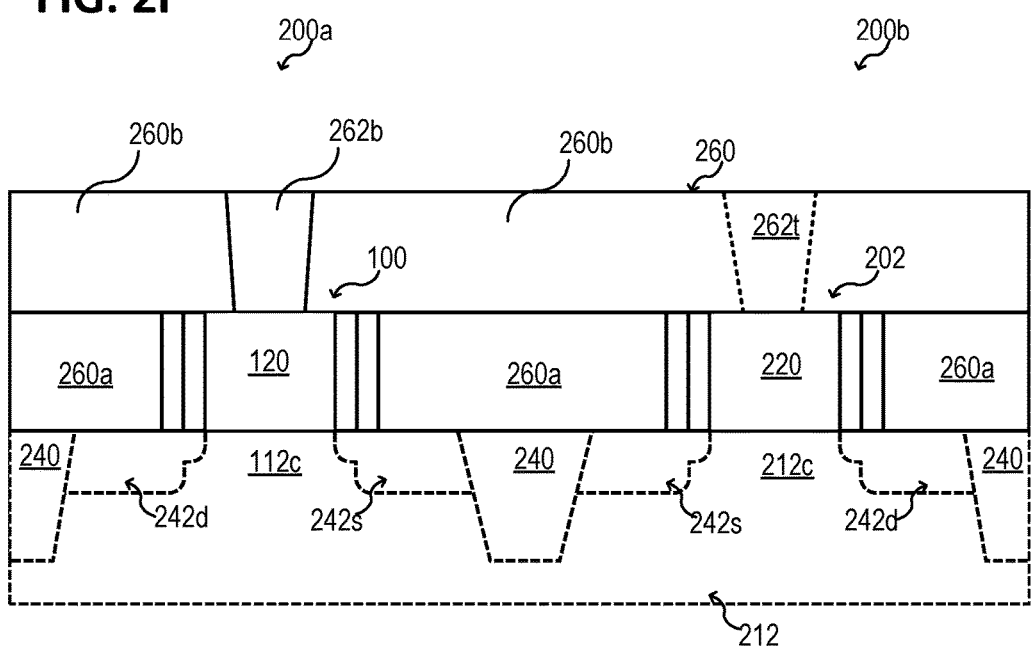

FIG. 2F shows the carrier 212 in a schematic cross-sectional view at a further processing stage, according to various embodiments. A metallization structure 260 may be formed over the memory cell 100 and the logic field-effect transistor 202. The metallization structure 260 may include one or more gate contact structures 262b, 262t, e.g., a memory gate contact structure 262b and a logic gate contact structure 262t). The one or more gate contact structures 262b, 262t may be embedded in (e.g., may be laterally surrounded by) a second insulator layer 260b. The second insulator layer 260b may include a dielectric material, e.g., silicon oxide (SiO$_2$), silicon nitride, etc., having, for example, a thickness in the range from about 10 nm to about 100 nm, e.g., a thickness of about 40 nm. The one or more gate contact structures 262b, 262t may include at least one metal layer, e.g., including tungsten (W), cobalt (Co), etc. The memory gate contact structure 262b may be in direct physical contact with the memory gate structure 120 (e.g., with the second electrode structure 128) of the memory cell 100. The logic gate contact structure 262t may be in direct physical contact with the logic gate structure 220 (e.g., with the gate electrode structure 220e) of the field-effect transistor. The logic gate contact structure 262t may be illustrated in dashed lines since they may be disposed in a different plane with respect to the cross-section illustrated in FIG. 2G.

FIG. 2G shows the carrier 212 in a schematic cross-sectional view at a further processing stage, according to various embodiments. According to various embodiments, the contact metallization 260 may further include one or more source/drain contact structures 262d, 262s electrically contacting the respective source/drain regions 242s, 242d of the memory cell 100 and the field-effect transistor 202. The one or more source/drain contact structures 262d, 262s may be illustrated in dashed lines since they may be disposed in a different plane with respect to the cross-section illustrated in FIG. 2G. As an example, the one or more source/drain contact structures 262d, 262s and the one or more gate contact structures 262b, 262t may be formed in a common metallization process.

A further metallization structure 280 may be formed over the contact metallization structure 260. The further metallization structure 280 may be a BEoL metallization, e.g., a single level or multilevel metallization including, for example, a copper wiring, a copper contact pad, etc. The further metallization structure 280 may have a thickness in the range from about 10 nm to about 100 nm, e.g. a thickness of about 60 nm.

According to various embodiments, the carrier 212 may be processed in a metal-last or a high-k last process flow or in any other suitable process flow.

According to various embodiments, the memory gate contact structure 262b may be formed by depositing an insulator material (for example SiO$_2$ or SiN) across the whole carrier 212 and by forming contact holes above the gate structures 120, 220 (e.g., by one or more lithography processes and wet or dry chemical etching). The contact hole may be either directly be formed above the gate structures 120, 220, i.e. above the active area, or, if this is not possible (e.g. because of design rules), then the contacting of the gate structures 120, 220 may be done with an offset to the active area. This offset to the active area is indicated in the figures by the dashed lines of the bulk and STI regions, which might not necessarily be located in the same cutline plane (this is the case for all regions highlighted with dashed lines in the following sections). The contact hole may be filled with a metal (e.g. tungsten) (see FIG. 2F).

Figure 2H:
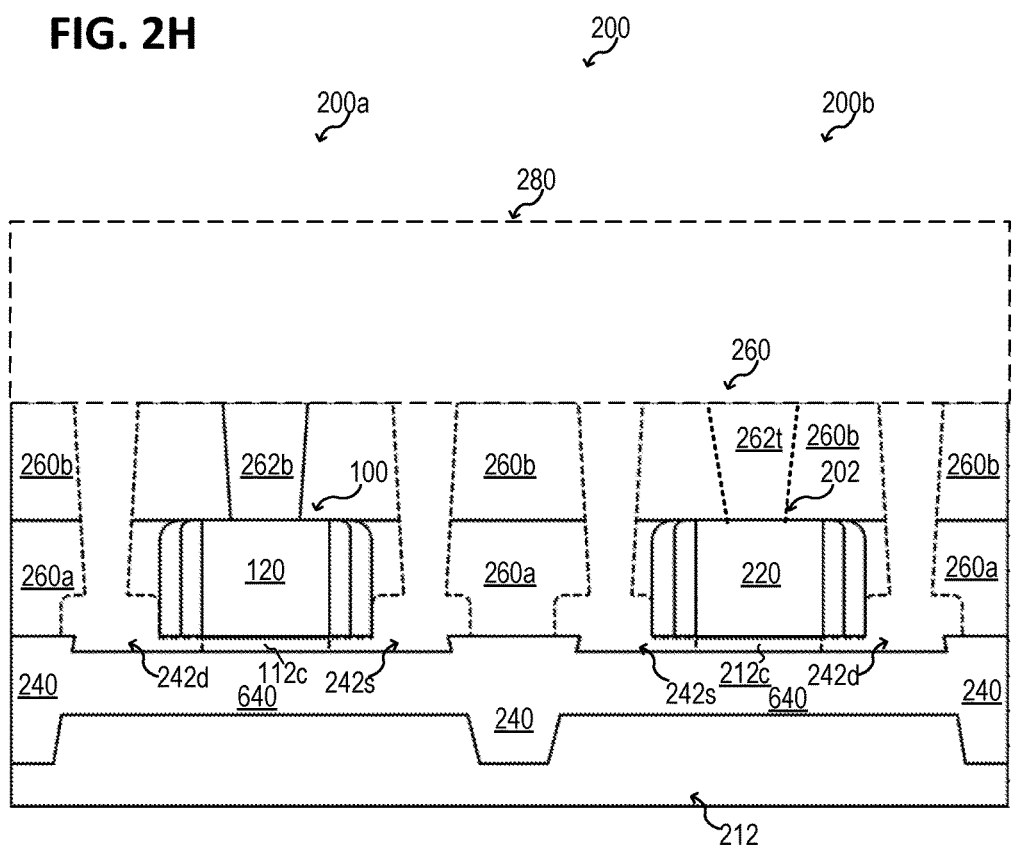
Figure 3A:
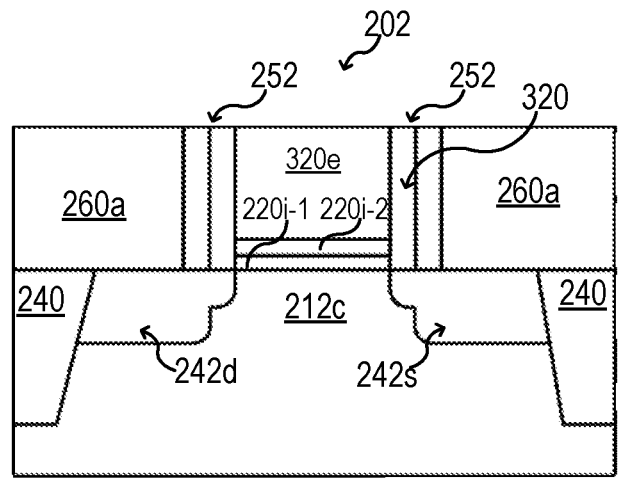
FIG. 3A to FIG. 3D show a carrier during processing a gate structure of a field-effect transistor structure in a schematic view, according to various embodiments.
Figure 3B:
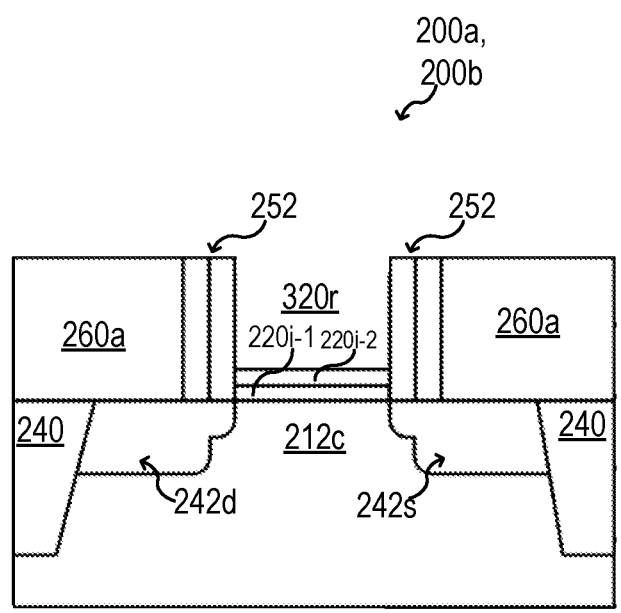
Figure 3C:
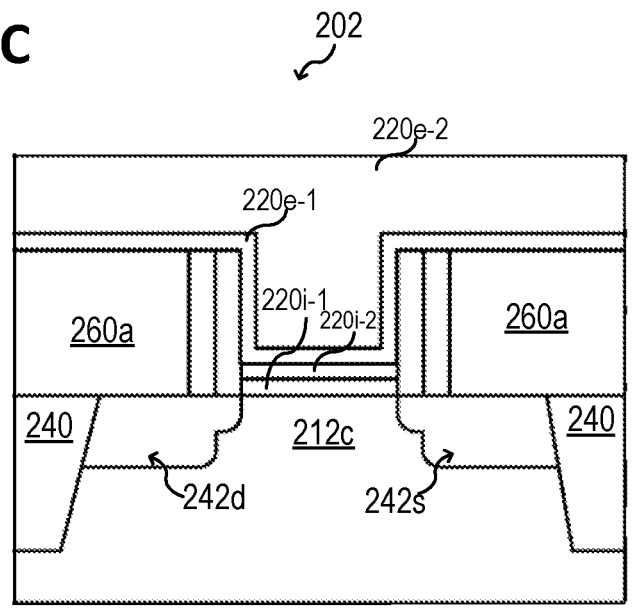
Figure 3D:
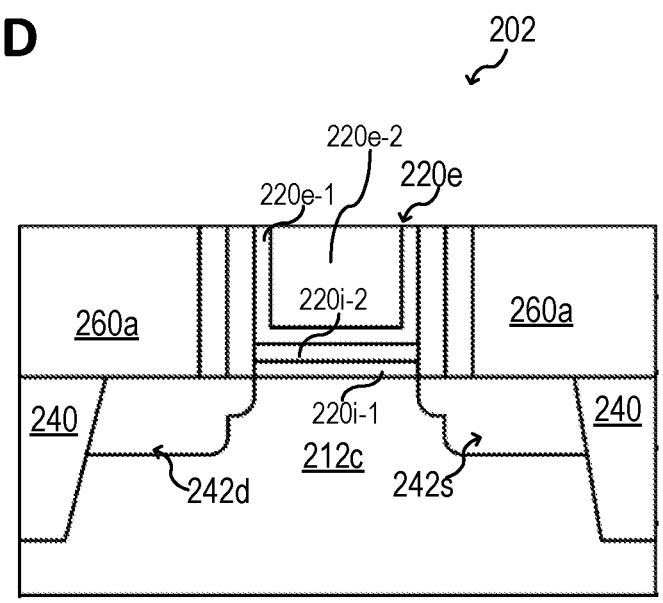
Figure 4A:
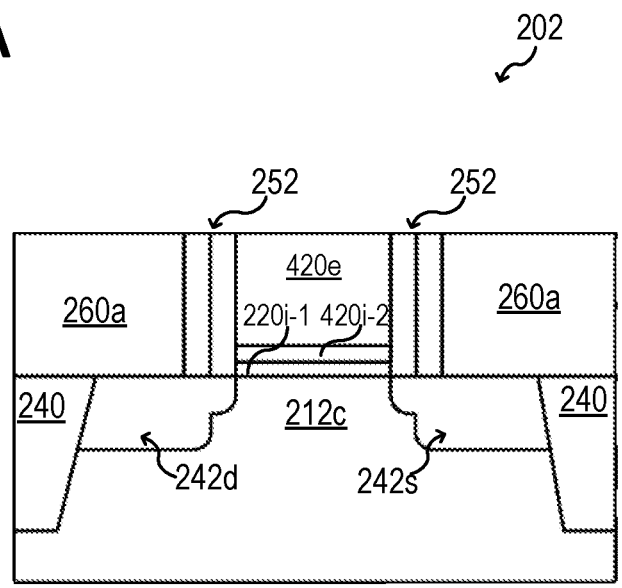
FIG. 4A to FIG. 4D show a carrier during processing a gate structure of a field-effect transistor structure in a schematic view, according to various embodiments.
Figure 4B:
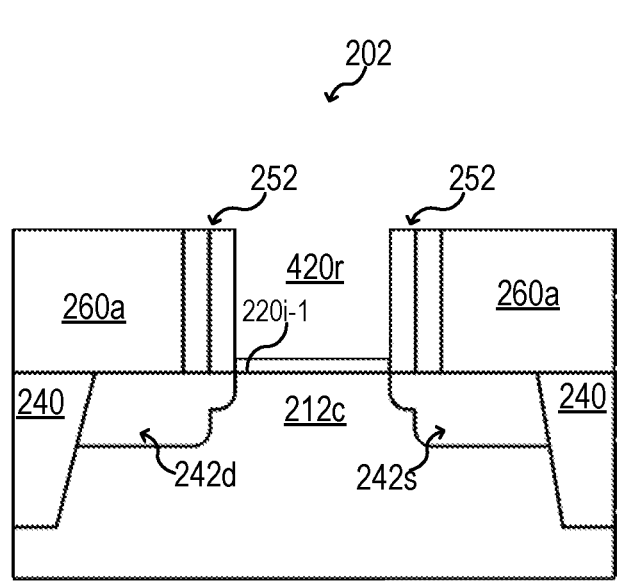
Figure 4C:
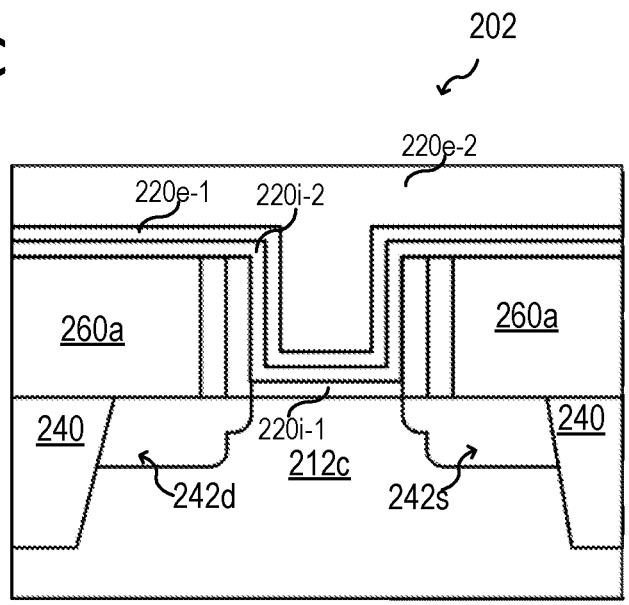
Figure 4D:
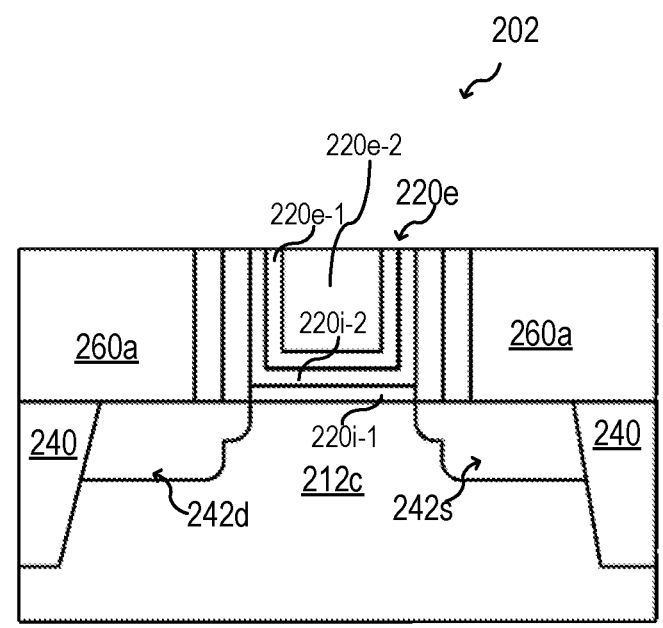

FIG. 2H illustrates a memory cell 100 (e.g., an electronic device 200) in a schematic cross-sectional view, according to various embodiments. In this integration scheme, the channels 112c, 212c of the memory cell 100 and the field-effect transistor 202 may be provided over an insulating layer 640 (illustratively the memory cell 100 and the field-effect transistor 202 are formed on a semiconductor (e.g., silicon) over insulator (SOI) carrier). Illustratively, the memory cell 100 and the field-effect transistor 202 may be configured as a FDSOI transistor.

FIG. 3A to FIG. 3D illustrate a carrier 212 during processing, e.g., during forming a field-effect transistor 202 in a gate last process flow (see FIG. 2D), according to various embodiments. According to various embodiments, a dummy gate electrode structure 320e (e.g., disposed between one or more spacers 252) may be removed. In this case, the gate isolation structure 220 (e.g., an interface layer 220i-1 and a high-k material layer 220i-2) may not be removed. The opening 320r generated by removing the dummy gate electrode structure 320e may be filled with the gate electrode structure 220e. According to various embodiments, at least one metal layer (e.g., a titanium nitride layer) 220e-1 may be deposited into the opening 320r via a conformal deposition process. The remaining part of the opening 320r may be filled with another electrically conductive gate material 220e-2, e.g., aluminum, poly-silicon, etc. A planarization may be carried out to remove electrically conductive material outside the opening 320r. As illustrated, for example, in FIG. 3D, at least one metal layer 220e-1 of the gate electrode structure 220e may have a u-shape.

FIG. 4A to FIG. 4D illustrate a carrier 212 during processing, e.g., during forming a field-effect transistor 202 in a high-k last process flow (see FIG. 2F), according to various embodiments.

According to various embodiments, a dummy gate electrode structure 420e (e.g., disposed between one or more spacers 252) and a dummy high-k layer 420i-2 may be removed. In this case, an interface layer 220i-1 of the gate isolation structure 220 (e.g., a silicon oxide layer) may not be removed. This allows, for example, to maintain a high quality interface to the semiconductor portion in the channel region 212c. The opening 420r generated by removing the dummy gate electrode structure 420e and the dummy high-k layer 420i-2 may be filled with a gate isolation layer 220i-2 and the gate electrode structure 220e. According to various embodiments, a high-k material layer 220i-2 and at least one metal layer (e.g., a titanium nitride layer) 220e-1 of the gate electrode structure 220e may be deposited into the opening 420r via a conformal deposition process. The remaining part of the opening 420r may be filled with another electrically conductive gate material 220e-2, e.g., aluminum, polysilicon, etc. A planarization may be carried out to remove high-k material and/or electrically conductive material outside the opening 420r. As illustrated, for example, in FIG. 4D, the high-k material layer 220i-2 and at least one metal layer 220e-1 of the gate electrode structure 220e may have a u-shape. According to various embodiments, the high-k material layer 220i-2 may be sacrificial layer.

According to various embodiments, during processing the one or more field-effect transistors 202 in the logic area 200b of the carrier, the memory area 200a of the carrier may be protected via a mask layer. The mask layer may cover the one or more memory cells 100 in the memory area 200a in the case that the one or more memory cells 100 are processed before the one or more field-effect transistors 202 are formed. Alternatively, the mask layer may cover dummy structures in the memory area 200a that may be used for forming the one or more memory cells 100 in the case that the one or more memory cells 100 are processed after the one or more field-effect transistors 202 are formed.

According to various embodiments, during processing the one or more memory cells 100 in the memory area 200a of the carrier, the logic area 200b of the carrier may be protected via a mask layer. The mask layer may cover the one or more field-effect transistors 202 in the logic area 200b in the case that the one or more memory cells 100 are processed after the one or more field-effect transistors 202 are formed. Alternatively, the mask layer may cover dummy structures in the logic area 200b that may be used for forming the one or more field-effect transistors 202 in the case that the one or more memory cells 100 are processed before the one or more field-effect transistors 202 are formed.

Various configurations and/or modifications with respect to the memory cell 100 are described in the following. For sake of brevity, with respect to similar or same structures and/or processes as described above reference is made thereto.

FIGS. 5A to 5G illustrate a carrier 212 during processing, e.g., during processing (e.g., manufacturing) a memory cell 100 or an electronic device 200, according to various embodiments.

Figure 5A:
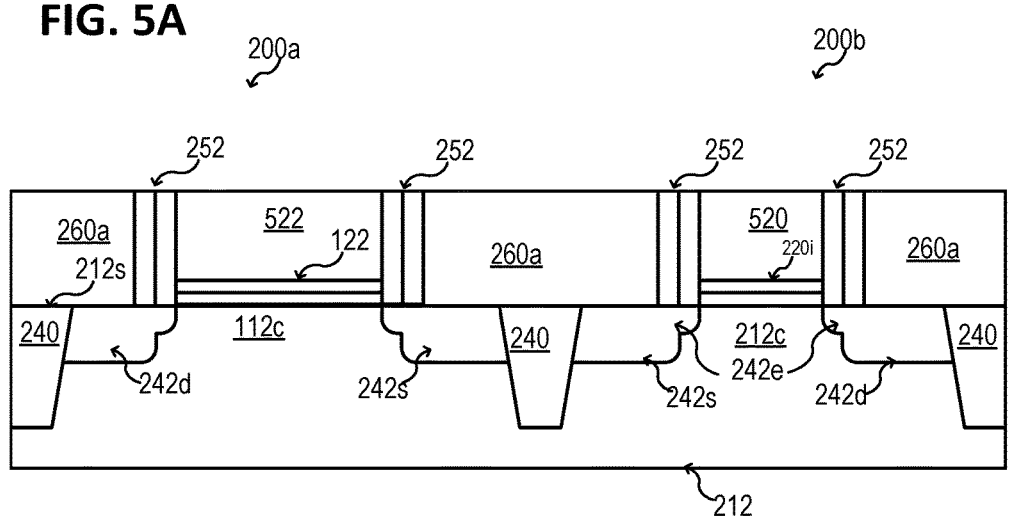
FIG. 5A to FIG. 5D show a carrier during processing a memory cell or an electronic device including a memory cell in a schematic view, according to various embodiments.

FIG. 5A shows the carrier 212 in a schematic cross-sectional view at an initial processing stage, according to various embodiments. According to various embodiments, one or more dummy structures 520, 522 may be used to form a memory cell 100 in the memory area 200a of the carrier 212 and a logic field-effect transistor 202 in the logic area 200b of the carrier 212.

Figure 5B:
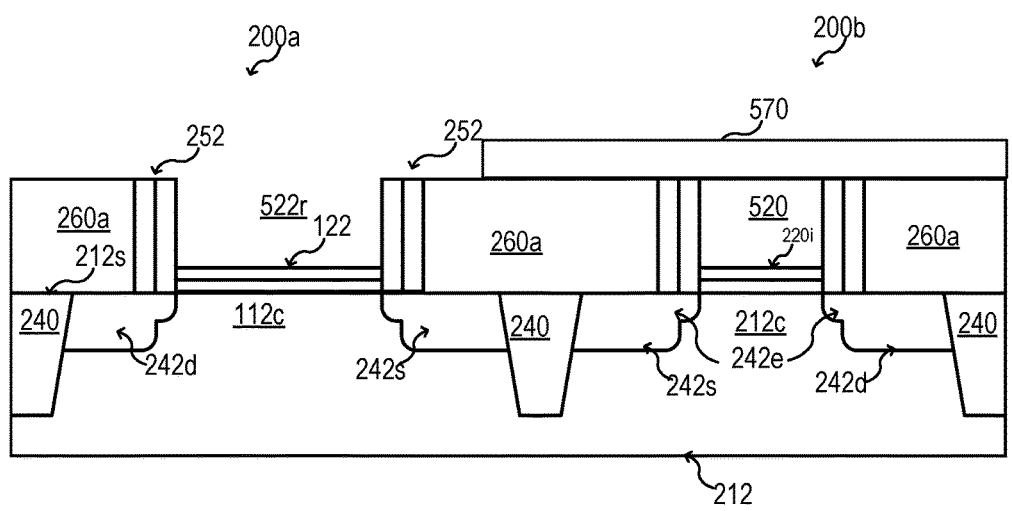

FIG. 5B shows the carrier 212 in a schematic cross-sectional view at a further processing stage, according to various embodiments. A hard mask 570 may be deposited and patterned by one or more lithographic processes. The hard mask 570 may cover the logic area 200b of the carrier 212, wherein the memory area 200a within which the one or more memory cells 100 shall be created, is exposed. In the memory area 200a, one or more materials of the already processed gate stack (e.g., a dummy gate stack) may be removed.

According to various embodiments, the dummy structure 522 may be a dummy gate electrode disposed over a gate isolation structure 122, wherein only the dummy gate electrode 522 (e.g., dummy polysilicon or a dummy metal) may be removed by an etching process, e.g., via wet chemical etching. Alternatively, one or more layers of the gate isolation structure 122 may be removed as well. The gate isolation structure 122 may include a high-k (HK) material and an interfacial oxide to the silicon bulk, wherein only the high-k (HK) material may be removed or wherein both the high-k (HK) material and the interfacial oxide may be removed. As an example, an unchanged interface to the silicon bulk may be maintained if at least the interfacial oxide to the silicon bulk is not removed. Alternatively, a write voltage reduction may be provided by completely removing the gate isolation structure 122 and forming the at least one remanent-polarizable layer 126 directly over the channel region 112c. The write voltage reduction may be achieved in this case since a voltage drop across an additional HK and an additional interface region is avoided.

According to various embodiments, the logic transistor 202 may be completely finished until before the dummy gate 520 removal. This allows for no invasiveness into the CMOS baseline until this point. It may be an advantage to avoid any modification to the CMOS baseline while forming the memory cell 100.

According to various embodiments, after the respective dummy structures is removed, an opening 522r may remain in the memory area 200a over the channel region 112c, e.g., between a spacer structure 252 or between any other suitable auxiliary structure.

Figure 5C:
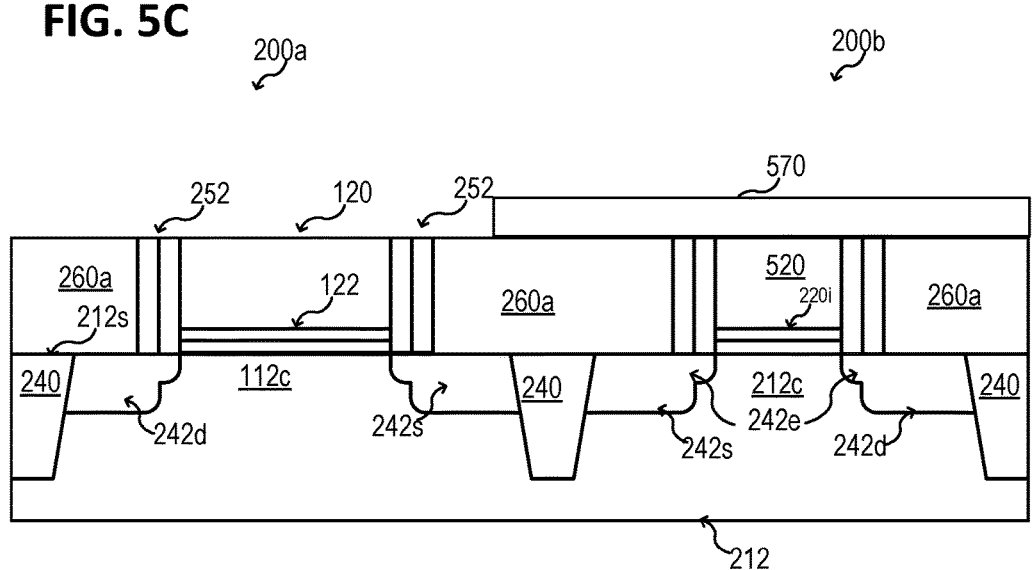

FIG. 5C shows the carrier 212 in a schematic cross-sectional view at a further processing stage, according to various embodiments. The memory gate structure 120 may be completed, as described above, by forming the respective layers in the opening 522r. The hard mask 570 covering the logic area 200b of the carrier 212 may be removed before, during, or after completing the memory gate structure 120.

According to various embodiments, the memory gate structure 120 may be formed without the first electrode structure 124 (e.g., illustratively without the bottom electrode) so that the at least one remanent-polarizable layer 126 may be disposed directly on the gate isolation structure 122. According to various embodiments, the memory gate structure 120 may be formed without the first electrode structure 124 and without the gate isolation structure 122 so that the at least one remanent-polarizable layer 126 may be disposed directly on the upper surface 212s of the carrier 212 over the channel region 112c. Various memory gate structures 120 are described in more detail below, see, for example, FIG. 7A to 7H.

According to various embodiments, the memory material, i.e. the ferroelectric hafnium oxide (FE-HfO$_2$), may be deposited into the opening 522r by atomic layer deposition (ALD) or any other suitable deposition process. Before the memory material is deposited in into the opening 522r, the first electrode structure 124 (e.g., the bottom electrode) may be deposited, e.g. by ALD or any other suitable deposition process. The conducting material (for example TiN, TaN, etc.) of the bottom electrode may have specific properties (e.g., a specific texture or crystal phase) that may promote the formation of the ferroelectric properties of FE-HfO$_2$ (e.g. higher ferroelectric crystal phase fraction) deposited directly on the bottom electrode. After the deposition of the memory material (e.g., of the at least one remanent-polarizable layer 126), a second electrode structure 128 (e.g., a top electrode) may be deposited (e.g. a TiN top electrode, etc.) followed by a gate material (e.g. aluminum) that may fill the opening 522r completely.

Figure 5D:
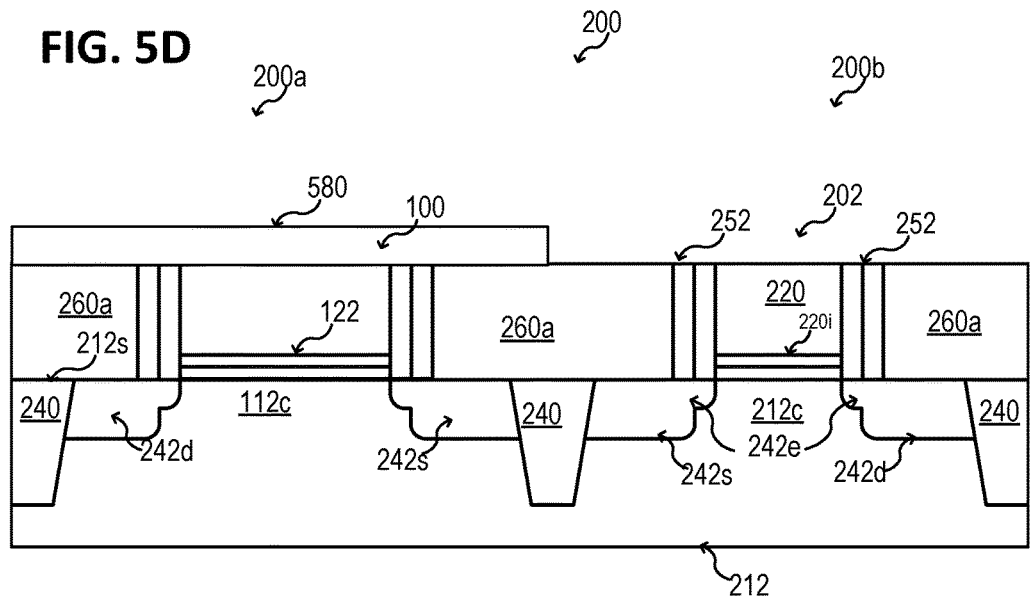

FIG. 5D shows the carrier 212 in a schematic cross-sectional view at a further processing stage, according to various embodiments. After the mask layer 570 over the logic area 200b is removed, an additional mask layer 580 may be formed over the memory area 200a and patterned to expose the carrier in the logic area 200b, if desired. The dummy structure 520 (e.g., a dummy gate of the field-effect transistor 202) may be removed and the logic gate structure of the field-effect transistor 202 may be completed, as, for example, described above with reference to FIG. 3A to FIG. 3D or FIG. 4A to FIG. 4D. Subsequently, the additional mask layer 580 may be removed. As illustrated in FIG. 5D, the carrier 212 may include a memory cell 100 in the memory area 200a and a field-effect transistor 202 in the logic area 200b.

According to various embodiments, the thickness of the bottom electrode may be utilized to improve the memory cell 100 performance as illustrated in more detail below, as illustrated in FIG. 6A to FIG. 6D in schematic cross-sectional views of the carrier 212 during processing.

According to various embodiments, as illustrated in FIG. 6A to FIG. 6D, the memory cell 100 may include a first electrode structure 124 (referred to herein as bottom electrode) and a second electrode structure 128. The second electrode structure 128 may include a first electrically conductive layer 128t (e.g., a TiN layer, etc.) and a second electrically conductive layer (e.g., an aluminum layer). The first electrically conductive layer 128t is referred to herein as top electrode and the second electrically conductive layer 128g is referred to herein as gate material. The memory cell 100 may include a gate isolation structure 122, e.g., having a first electrically insulating layer 122-1 (referred to herein as interface layer) including, for example, silicon oxide, and a second electrically insulating layer 122-2, e.g., a high-k material layer.

According to various embodiments, the bottom electrode thickness may be increased from a first thickness 124d-1 (see FIG. 6A and FIG. 6C) to a second thickness 124d-2 (see FIG. 6B and FIG. 6D), the projected area of the top electrode 128t down to the bottom electrode 124 is reduced from a first area 124a-1 to a second area 124a-2. The projected area from the top electrode to the bottom electrode may define the capacitive voltage divider 106, as described herein, a smaller projected area may lead to a higher relative voltage drop across at least one remanent-polarizable layer 126 (the contribution of the capacitance from the sidewalls may be negligible or avoided by using a modified memory gate structure 120, see, for example, FIG. 1A). Changing the above-mentioned capacitive voltage divider 106 has in general several positive effects on memory cell 100 performance, which are described in more detail below.

Increasing the bottom electrode thickness 124d to adjust the gate voltage divider 160 may allow to keep the thickness of the at least one remanent-polarizable layer 126 in an optimal range. Changing the ferroelectric film thickness may affect the ferroelectric properties of a ferroelectric layer. Therefore, being able to change the gate stack voltage divider without changing the film thickness of a ferroelectric layer as the memory layer may allow implementing a memory cell 100 with optimal performance.

According to various embodiments, the bottom electrode 124 may be deposited into the gate cavity (see, for example, the opening 522r in FIG. 5B) via a conformal deposition process, so that the bottom electrode 124 may cover the sidewalls of the gate cavity. The at least one remanent-polarizable layer 126, e.g., the ferroelectric material, may be deposited on top of a high-k gate stack or a high-k metal-gate stack. According to various embodiments, the thickness 124d of the bottom electrode 124 may be varied such that an area ratio of the first area 124a-1 to the second area 124a-2 may be in the range from about 1 to about 2, or in the range from about 2 to about 5, or greater than 5.

Figure 6C:
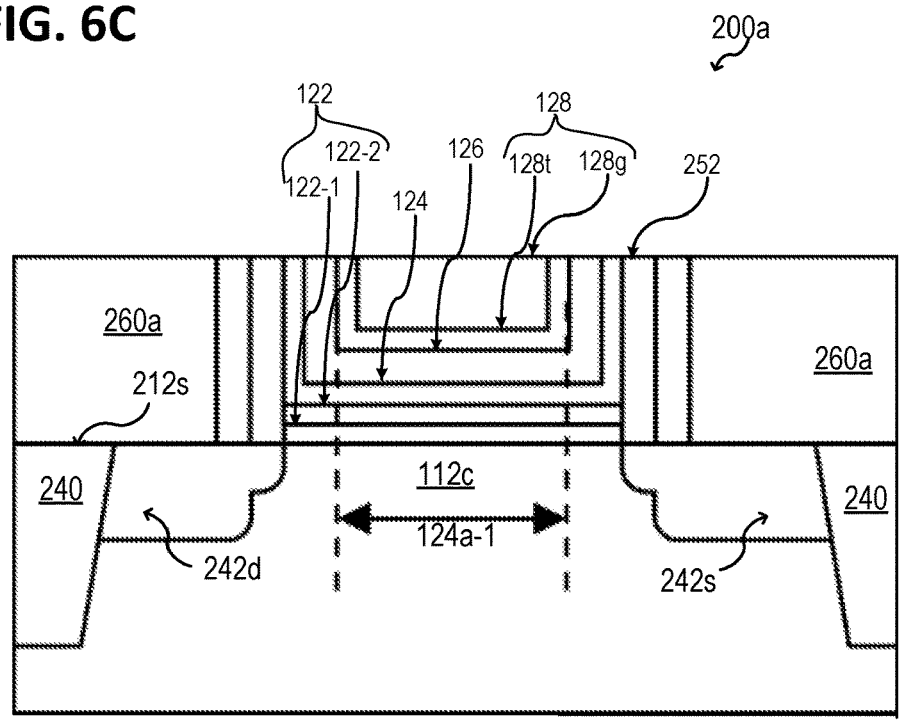
Figure 6D:
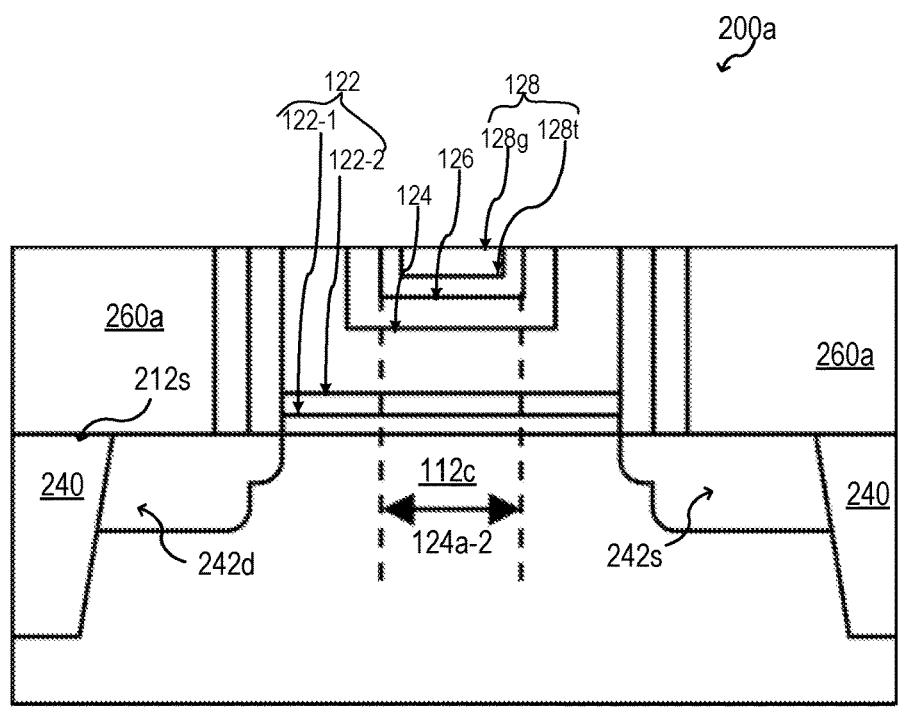
Figure 6E:
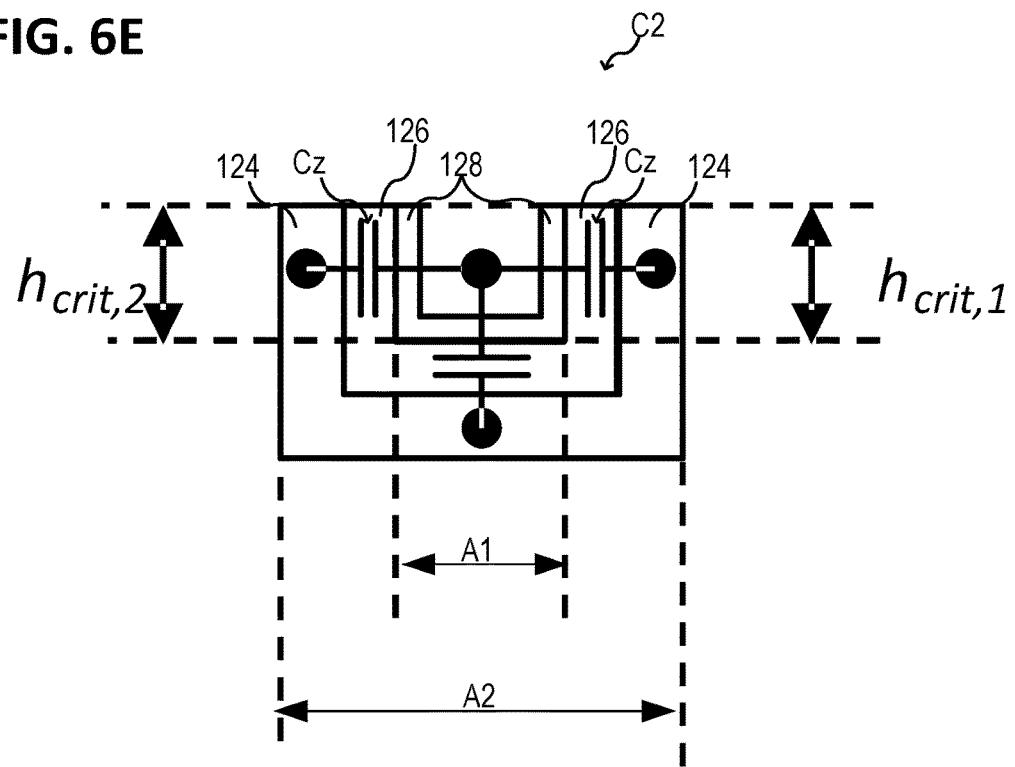
FIG. 6E shows a memory structure of a memory cell in a schematic view, according to various embodiments.

FIG. 6E illustrates the second capacitor structure C2 (also referred to as FeCap) resulting from the at least one remanent-polarizable layer 126 that is disposed between the respective electrode structures 124, 128. According to various embodiments, the memory cell 100 may be configured (e.g., the process flow, the device geometry, layer thicknesses, etc. may be selected) such that the remaining height $h_{crit}$ may be as small as possible. The remaining height $h_{crit}$ may cause an additional sidewall contribution $C_z$ (see an equivalent circuit in FIG. 6E) that adds to the FeCap capacitance and may act against a reduction of the FeCap capacitance. That is, the actual FeCap capacitance has various contributions as illustrated, for example, in FIG. 6E. The respective capacitor areas may be determined geometrically considering $h_{crit,1}$, $h_{crit,2}$ and A1. A1 may define the x-y-contribution to the capacitance and $h_{crit,1}$, $h_{crit,2}$ may define the z-y-contribution $C_z$ to the capacitance (see, for example, FIG. 1C). In a similar way, a corresponding z-x-contribution $C_z$ to the capacitance may be considered. According to various embodiments, A1 may be greater than $h_{crit,1}$ and $h_{crit,2}$ but also smaller than A2. A2 may define the x-y-contribution to the capacitance of the MIS layer stack (C1) disposed below the FeCap, as described above.

According to various embodiments, the effective area of the capacitor structures may be geometrically determined, e.g., via an orthogonal projection. As an example, in the case that a capacitor includes non-planar (e.g., angled, see FIG. 6E) sections, the effective capacitor area may be determined by considering sections of the capacitor in which the corresponding electrode sections are equidistant. As illustrated, for example, in FIG. 1C, the effective area contributions (e.g., in the x-y-plane, and in the z-y-plane) may be associated with the capacitance contributions 100x, 100z, as described above, indicated between the dashed lines. In some aspects, e.g., as a first approximation, stray fields (e.g., arising in the corners 150 of the capacitor and/or outside the effective area) may be neglected for determining the effective area and the capacitance contributions.

FIG. 7A to 7H show various memory gate structures 120 of a memory cell 100 in a schematic cross-sectional view, according to various embodiments. The memory gate structures 120 may be varied with respect to the number, the size, the shape, the arrangement, etc., of the respective layers that may be used to form the memory gate structures 120. The memory gate structures 120 may include at least one remanent-polarizable layer 126 and an electrode structure 128 (e.g., including at least a top electrode 128t) disposed over the at least one remanent-polarizable layer 126.

Figure 7A:
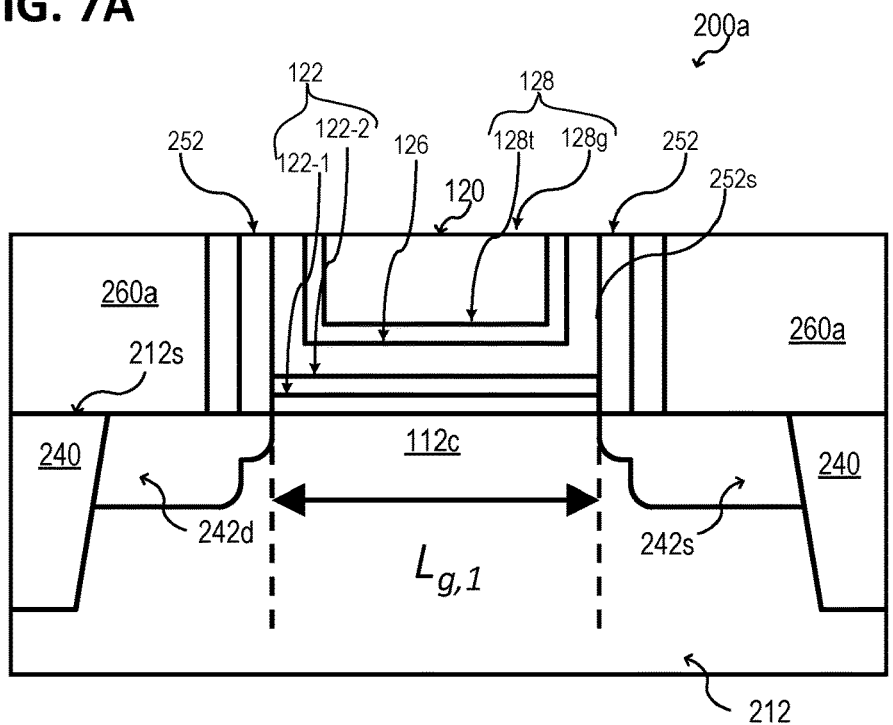
FIG. 7A to FIG. 7H show various memory cells in a schematic view, according to various embodiments.

FIG. 7A shows a memory cell 100 in a schematic cross-sectional view, according to various embodiments. The memory cell 100 may include a memory gate structure 120 disposed over the channel region 112c within any suitable carrier 212. The channel region 112c may define the channel length $L_{g-1}$. The memory gate structure 120 may include a gate isolation structure 122 disposed over (e.g., directly on) the channel region 112c. The gate isolation structure 122 may include one or more electrically insulating layers 122-1, 122-2, e.g., a first insulating layer 122-1 as interface layer (e.g., a silicon oxide layer) and a second insulating layer 122-2 including a high-k material. The memory gate structure 120 may further include at least one remanent-polarizable layer 126 disposed over (e.g., directly on) the gate isolation structure 122. The at least one remanent-polarizable layer 126 may be a single layer of a ferroelectric material (e.g., ferroelectric hafnium oxide) or may include any other one or more suitable remanent-polarizable layers 126. The memory gate structure 120 may further include an electrode structure 128 (also referred to as second electrode structure) disposed over (e.g., directly on) the at least one remanent-polarizable layer 126. The electrode structure 128 may include one or more electrically conductive layers 128t, 128g, e.g., a first electrically conductive layer 128t forming a top electrode (e.g., a titanium nitride layer) and a second electrically conductive layer 128g including gate material (e.g., aluminum). The memory gate structure 120 may be laterally surrounded by a support structure 252. The support structure 252 may include or may be at least one electrically insulating portion, e.g., the support structure 252 may include one or more spacer structures, one or more insulator portions, etc. As an example, at least one spacer structure 252 may be disposed laterally next to the memory gate structure 120. Further, a dielectric layer 260a (e.g., a pre-metal dielectric layer disposed over the carrier 212) may be disposed laterally surrounding the memory gate structure 120 and the at least one spacer structure 252. The dielectric layer 260a may include silicon oxide or any other suitable dielectric material.

As illustrated in FIG. 7A, according to various embodiments, the at least one remanent-polarizable layer 126 may extend along a sidewall 252s of the support structure 252 surrounding the memory gate structure 120, e.g., the at least one remanent-polarizable layer 126 may (e.g., vertically) extend along a sidewall 252s of the one or more spacer structures 252. Illustratively, the at least one remanent-polarizable layer 126 may have a concave shape (e.g., a u-shape). Further, the first electrically conductive layer 128t may have a concave shape (e.g., a u-shape). The second electrically conductive layer 128g may fill the remaining space defined by the concave shape of the first electrically conductive layer 128t, completely. The concave shape of the at least one remanent-polarizable layer 126 and of the first electrically conductive layer 128t may be achieved by forming these layers via a conformal deposition process into an opening defined by the support structure 252 (e.g., the one or more spacer structures).

Figure 7B:
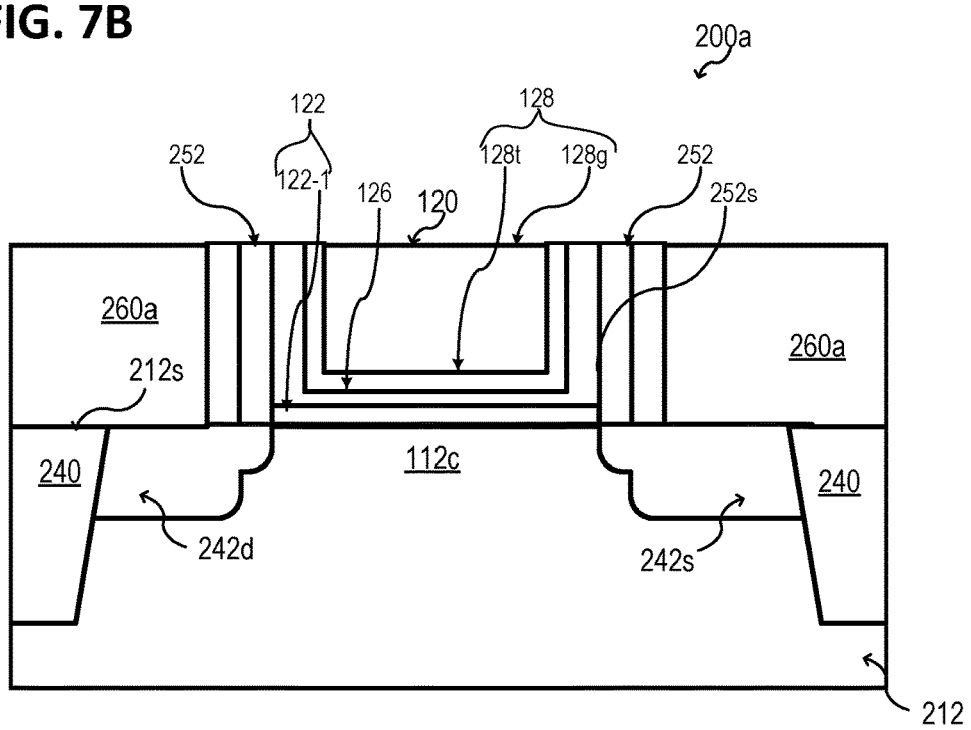

FIG. 7B shows a memory cell 100 in a schematic cross-sectional view, according to various embodiments. The memory cell 100 may include a memory gate structure 120 disposed over the channel region 112c within any suitable carrier 212. The memory gate structure 120 may include a gate isolation structure 122 disposed over (e.g., directly on) the channel region 112c. The gate isolation structure 122 may include an electrically insulating layer 122-1, e.g., an interface layer (e.g., a silicon oxide layer). The memory gate structure 120 may further include at least one remanent-polarizable layer 126 disposed over (e.g., directly on) the gate isolation structure 122. The at least one remanent-polarizable layer 126 may be a single layer of a ferroelectric material (e.g., ferroelectric hafnium oxide) or may include any other one or more suitable remanent-polarizable layers 126. The memory gate structure 120 may further include an electrode structure 128 (also referred to as second electrode structure) disposed over (e.g., directly on) the at least one remanent-polarizable layer 126. The electrode structure 128 may include one or more electrically conductive layers 128t, 128g, e.g., a first electrically conductive layer 128t forming a top electrode (e.g., a titanium nitride layer) and a second electrically conductive layer 128g including gate material (e.g., aluminum). The memory gate structure 120 may be laterally surrounded by a support structure 252. As an example, at least one spacer structure 252 may be disposed laterally next to the memory gate structure 120. Further, a dielectric layer 260a (e.g., a pre-metal dielectric layer disposed over the carrier 212) may be disposed laterally surrounding the memory gate structure 120 and the at least one spacer structure 252. The dielectric layer 260a may include silicon oxide or any other suitable dielectric material.

According to various embodiments, the electrically insulating layer 122-1 illustrated in FIG. 7B may be optional, or in other words, the memory gate structure 120 may not include a gate isolation structure 122, wherein, in this case, the at least one remanent-polarizable layer 126 may electrically isolate the channel region from the electrode structure 128.

As illustrated in FIG. 7B, according to various embodiments, the at least one remanent-polarizable layer 126 may extend along a sidewall 252s of the support structure 252 surrounding the memory gate structure 120, e.g., the at least one remanent-polarizable layer 126 may (e.g., vertically) extend along a sidewall 252s of the one or more spacer structures 252. Illustratively, the at least one remanent-polarizable layer 126 may have a concave shape (e.g., a u-shape). Further, the first electrically conductive layer 128t may have a concave shape (e.g., a u-shape). The second electrically conductive layer 128g may fill the remaining space defined by the concave shape of the first electrically conductive layer 128t, completely. The concave shape of the at least one remanent-polarizable layer 126 and of the first electrically conductive layer 128t may be achieved by forming these layers via a conformal deposition process into an opening defined by the support structure 252 (e.g., the one or more spacer structures).

Figure 7C:
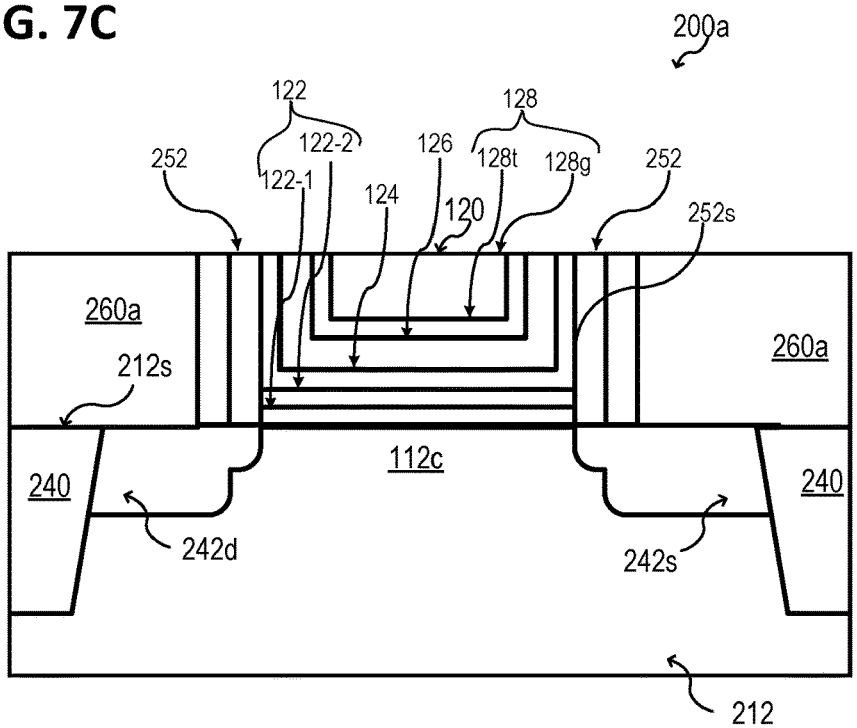

FIG. 7C shows a memory cell 100 in a schematic cross-sectional view, according to various embodiments (see FIG. 6C). The memory cell 100 may include a memory gate structure 120 disposed over the channel region 112c within any suitable carrier 212. The memory gate structure 120 may include a gate isolation structure 122 disposed over (e.g., directly on) the channel region 112c. The gate isolation structure 122 may include one or more electrically insulating layers 122-1, 122-2, e.g., a first insulating layer 122-1 as interface layer (e.g., a silicon oxide layer) and a second insulating layer 122-2 including a high-k material. The memory gate structure 120 may further include a first electrode structure 124, e.g., a bottom electrode (e.g., a titanium nitride layer), disposed over (e.g., directly on) the gate isolation structure 122. The memory gate structure 120 may further include at least one remanent-polarizable layer 126 disposed over (e.g., directly on) first electrode structure 124. The at least one remanent-polarizable layer 126 may be a single layer of a ferroelectric material (e.g., ferroelectric hafnium oxide) or may include any other one or more suitable remanent-polarizable layers 126. The memory gate structure 120 may further include a second electrode structure 128 disposed over (e.g., directly on) the at least one remanent-polarizable layer 126. The electrode structure 128 may include one or more electrically conductive layers 128t, 128g, e.g., a first electrically conductive layer 128t forming a top electrode (e.g., a titanium nitride layer) and a second electrically conductive layer 128g including gate material (e.g., aluminum). The memory gate structure 120 may be laterally surrounded by a support structure 252. As an example, at least one spacer structure 252 may be disposed laterally next to the memory gate structure 120. Further, a dielectric layer 260a (e.g., a pre-metal dielectric layer disposed over the carrier 212) may be disposed laterally surrounding the memory gate structure 120 and the at least one spacer structure 252. The dielectric layer 260a may include silicon oxide or any other suitable dielectric material.

As illustrated in FIG. 7C, according to various embodiments, the first electrode structure 124 may extend along a sidewall 252s of the support structure 252 surrounding the memory gate structure 120, e.g., the first electrode structure 124 may (e.g., vertically) extend along a sidewall of the one or more spacer structures. Illustratively, the first electrode structure 124 may have a concave shape (e.g., a u-shape). Further, the at least one remanent-polarizable layer 126 may have a concave shape (e.g., a u-shape). Further, the first electrically conductive layer 128t may have a concave shape (e.g., a u-shape). The second electrically conductive layer 128g may fill the remaining space defined by the concave shape of the first electrically conductive layer 128t, completely. The concave shape of the first electrode structure 124, the at least one remanent-polarizable layer 126, and of the first electrically conductive layer 128t of the second electrode structure 128 may be achieved by forming these layers via a conformal deposition process into an opening defined by the support structure 252 (e.g., the one or more spacer structures).

According to various embodiments, the thickness of the first electrode structure 124 may be varied to modify the lateral dimension of the interface between the at least one remanent-polarizable layer 126 and the first electrode structure 124, as described herein (see, for example, FIG. 6D).

According to various embodiments, the at least one remanent-polarizable layer 126 and the second electrode structure 128 of the memory gate structure 120, as illustrated in FIG. 7C, may be formed after a metal-last process flow is finished, wherein the metal deposited into the opening during the metal-last process flow may be the first electrode structure 124. The logic field-effect transistor 202 in the logic area may be formed in the very same metal-last process flow.

Figure 7D:
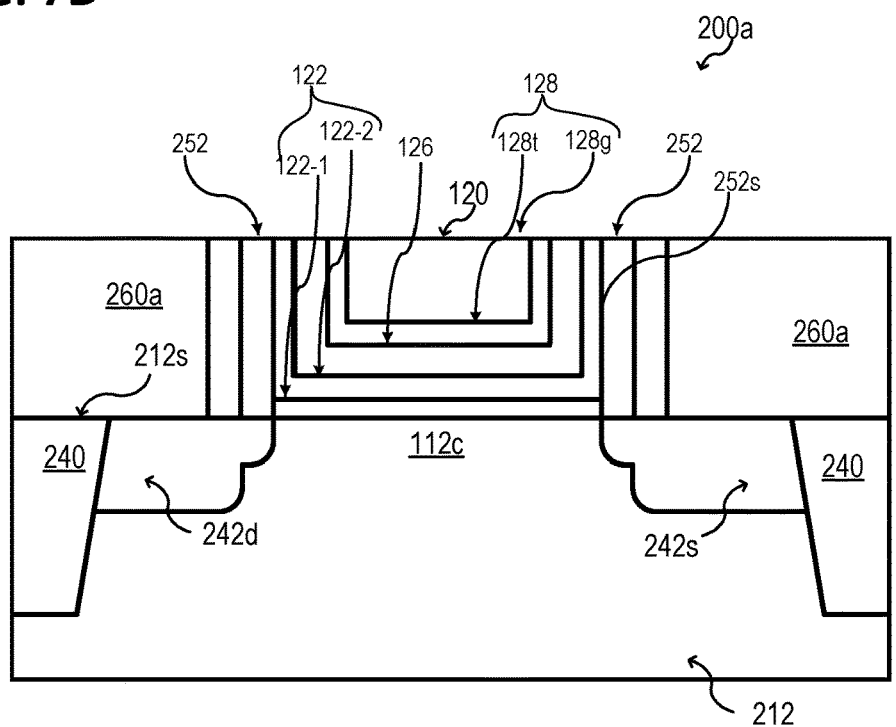

FIG. 7D shows a memory cell 100 in a schematic cross-sectional view, according to various embodiments. The memory gate structure 120 of the memory cell 100 may be formed in a similar way as described above with reference to FIG. 7A, e.g., including the modification, that the at least one remanent-polarizable layer 126 and the electrode structure 128 are formed after a HK-last process flow is finished and after removal of the HK-last metal material in the memory area 200a. The logic field-effect transistor 202 in the logic area may be formed in the very same HK-last process flow.

Figure 7E:
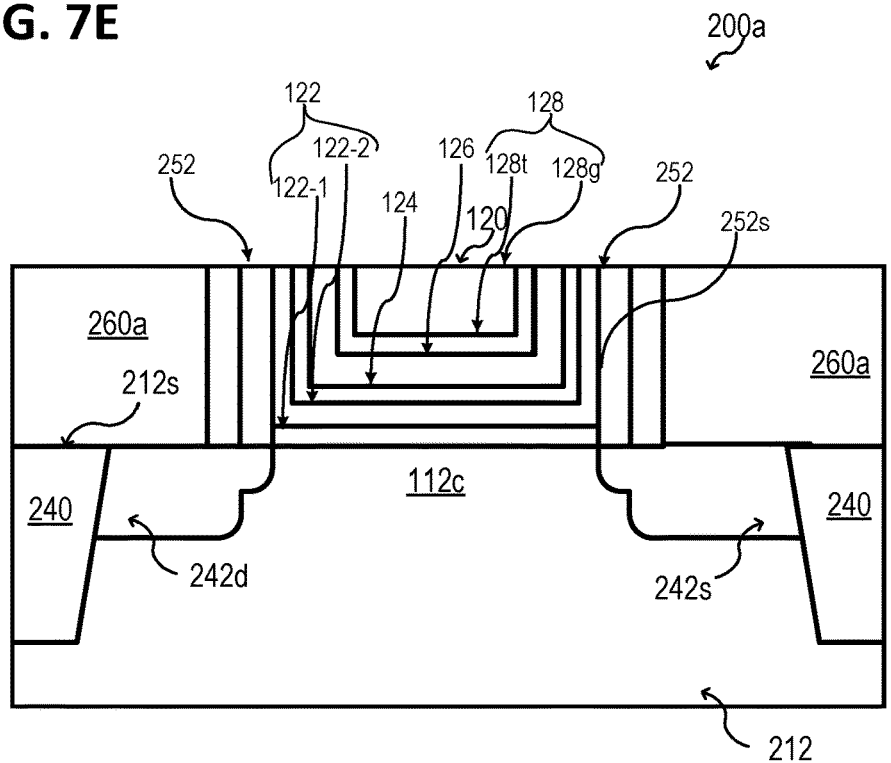

FIG. 7E shows a memory cell 100 in a schematic cross-sectional view, according to various embodiments. The memory gate structure 120 of the memory cell 100 may be formed in a similar way as described above with reference to FIG. 7C and FIG. 7D, e.g., including the modification, that the at least one remanent-polarizable layer 126 and the electrode structure 128 are formed after a HK-last process flow is finished. According to various embodiments, the metal deposited into the opening during the HK-last process flow may be the first electrode structure 124. The logic field-effect transistor 202 in the logic area may be formed in the very same HK-last process flow. Alternatively, the HK-last metal material in the memory area 200a may be removed before the first electrode structure 124, the at least one remanent-polarizable layer 126, and the second electrode structure 128 are formed.

As illustrated in FIG. 7D and FIG. 7E, according to various embodiments, in the case that, for example, a HK-last process flow is used, the second insulating layer 122-2 of the gate isolation structure 122 including the high-k material may extend along a sidewall 252s of the support structure 252 surrounding the memory gate structure 120, e.g., the second insulating layer 122-2 including the high-k material may (e.g., vertically) extend along a sidewall of the one or more spacer structures. Illustratively, the second insulating layer 122-2 and the at least one remanent-polarizable layer 126 may have a concave shape (e.g., a u-shape). Optionally, if the first electrode structure 124 is used in the memory gate structure 120, the first electrode structure 124 may have a concave shape (e.g., a u-shape). Further, the first electrically conductive layer 128t may have a concave shape (e.g., a u-shape). The second electrically conductive layer 128g may fill the remaining space defined by the concave shape of the first electrically conductive layer 128t, completely. The concave shape of the respective layers may be achieved by forming these layers via a conformal deposition process into an opening defined by the support structure 252 (e.g., the one or more spacer structures).

Figure 7F:
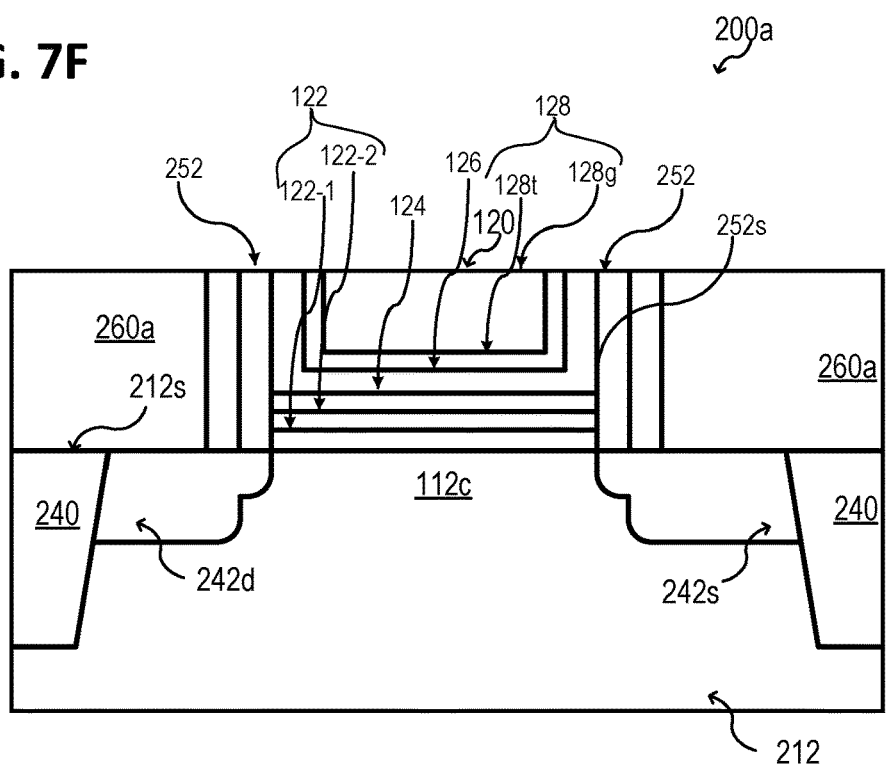

FIG. 7F shows a memory cell 100 in a schematic cross-sectional view, according to various embodiments. The memory gate structure 120 of the memory cell 100 may be formed in a similar way as described above with reference to FIG. 7C and FIG. 7E, e.g., including the modification, that at least one remanent-polarizable layer 126 and the second electrode structure 128 are formed on top of first electrode structure 124 that is formed before the dummy gate removal. In this case the at least one remanent-polarizable layer 126 may extend along a sidewall of the support structure 252 surrounding the memory gate structure 120, e.g., the at least one remanent-polarizable layer 126 may (e.g., vertically) extend along a sidewall 252s of the one or more spacer structures 252.

Figure 7G:
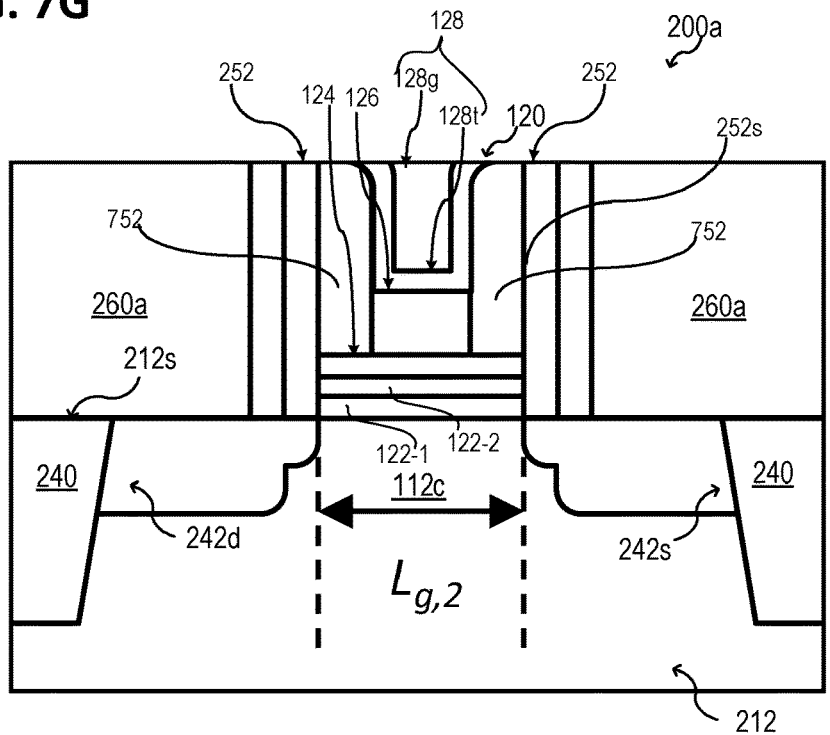

FIG. 7G shows a memory cell 100 in a schematic cross-sectional view, according to various embodiments. The memory gate structure 120 of the memory cell 100 may be formed in a similar way as described above with reference to FIG. 7F, e.g., including the modification, that the lateral dimension of the at least one remanent-polarizable layer 126 and of the second electrode structure 128 is reduced via an additional support structure 752 (e.g., via one or more electrically insulating portions, via one or more spacer structures, etc.). The channel region 112c may define a channel length $L_{g\text{-}2}$.

Figure 7H:
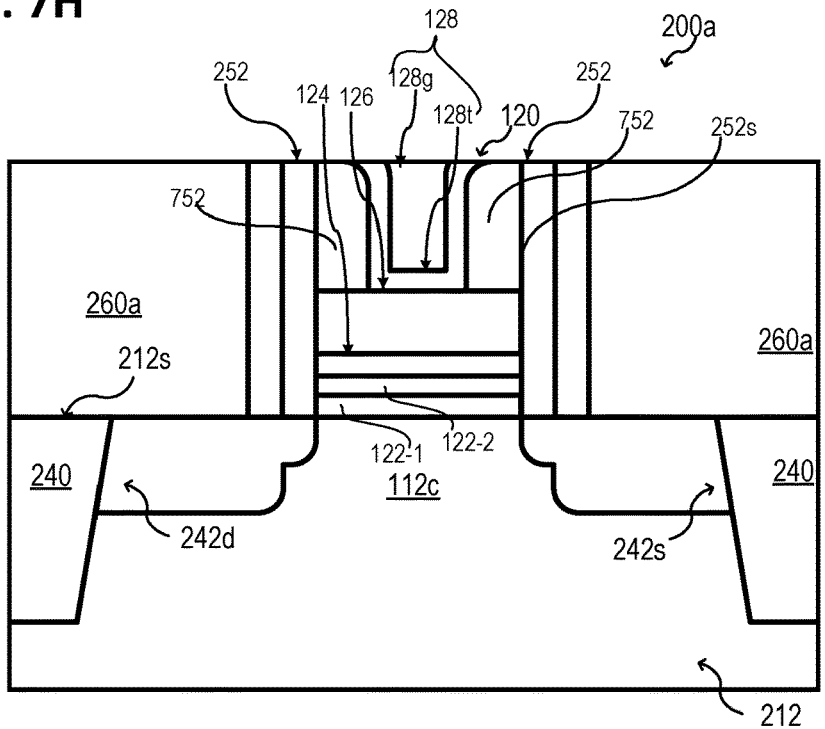

FIG. 7H shows a memory cell 100 in a schematic cross-sectional view, according to various embodiments. The memory gate structure 120 of the memory cell 100 may be formed in a similar way as described above with reference to FIG. 7F, e.g., including the modification, that the lateral dimension of the second electrode structure 128 is reduced via an additional spacer structure 752.

As illustrated in FIG. 7G and FIG. 7H, the width of the ferroelectric capacitor C2 formed by the at least one remanent-polarizable layer 126 and the adjacent electrode structures 124, 128 may be reduced to a sub-lithographic range, as described in more detail below. The capacitor area of the ferroelectric capacitor C2 may be defined by the projection of the bottom surface of the second electrode structure 128 (facing the at least one remanent-polarizable layer 126) to the first electrode structure 124.

Figure 8A:
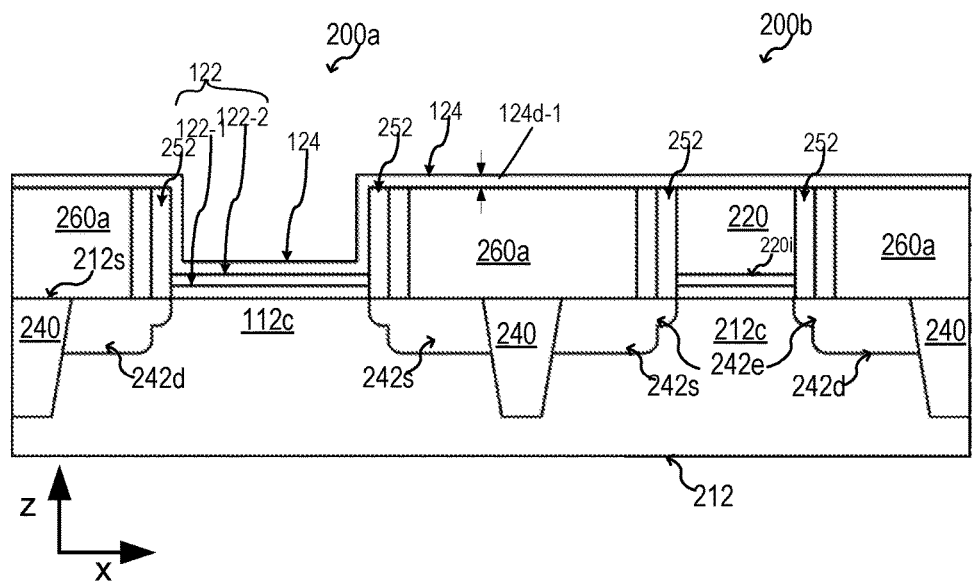
Figure 8B:
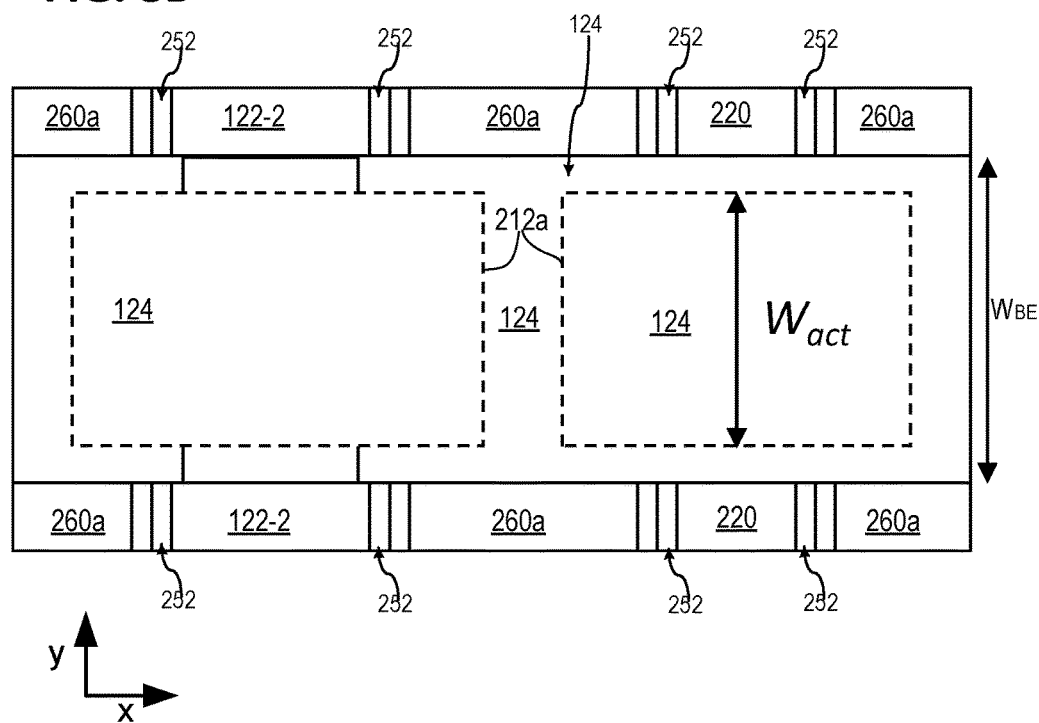

FIG. 8A and FIG. 8B show a carrier 212 during processing in a schematic cross-sectional view and a corresponding top view, according to various embodiments. The carrier 212 may be processed in the same or similar way as, for example, illustrated in FIG. 6A to FIG. 6D. In this processing stage, the first electrode structure 124 is formed over the gate isolation structure 122. The first electrode structure 124 is deposited as conformal layer and patterned subsequently.

Figure 8C:
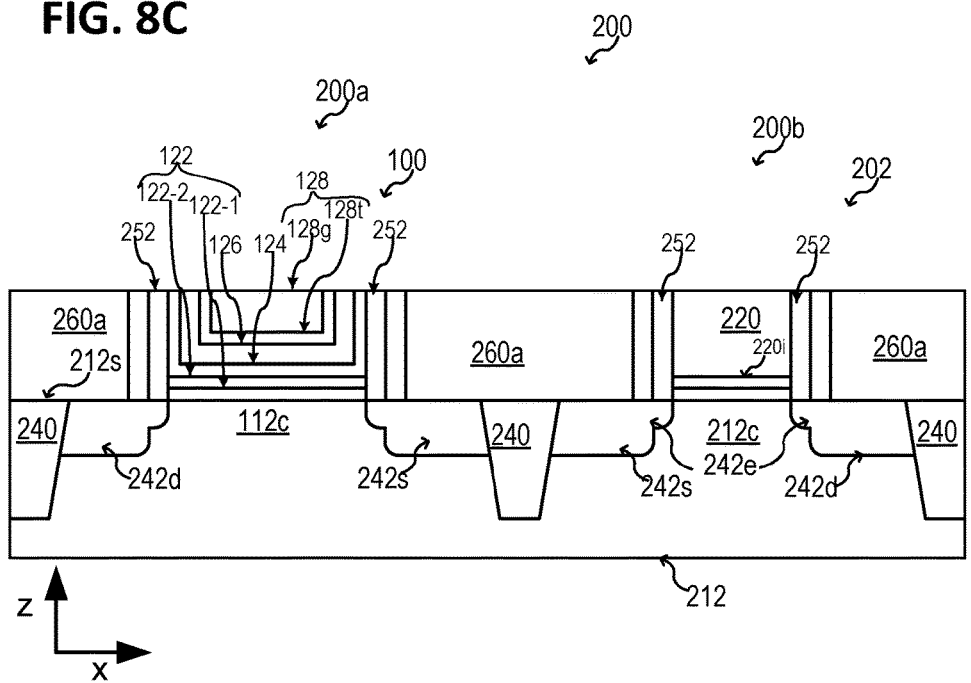
Figure 8D:
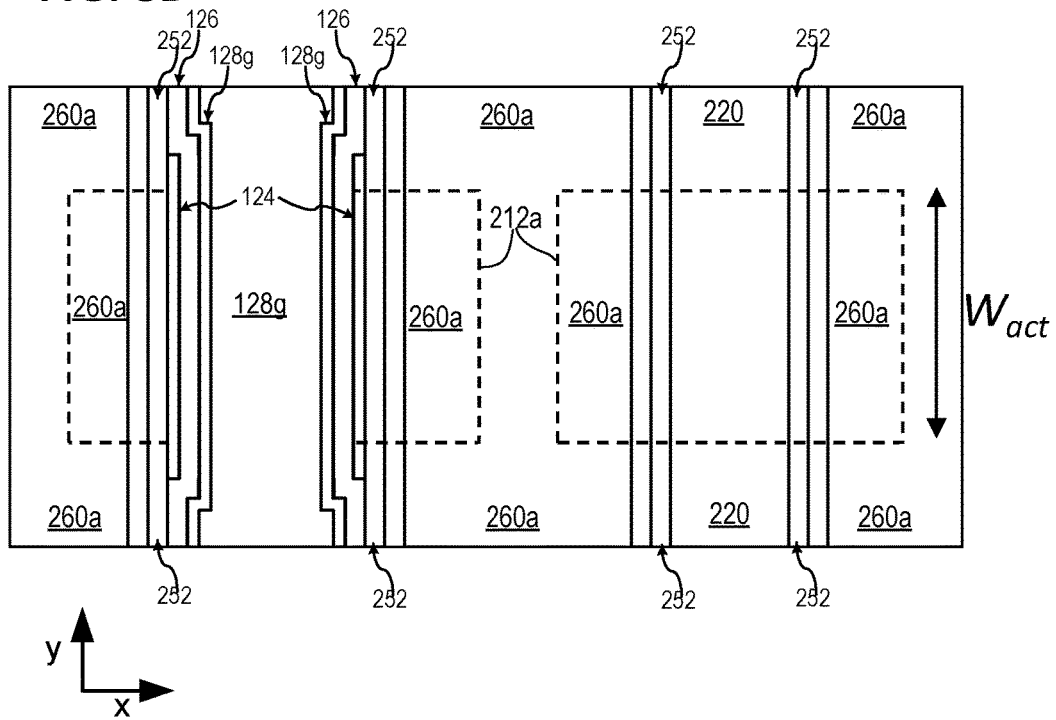

FIG. 8C and FIG. 8D show the carrier 212 as illustrated in FIG. 8A and FIG. 8B at a further processing stage in a schematic cross-sectional view and a corresponding top view, according to various embodiments (see FIG. 6A to FIG. 6D). In this processing stage, the at least one remanent-polarizable layer 126 is formed over the first electrode structure 124 and the first electrode structure 128 is formed over the at least one remanent-polarizable layer 126. The upper surface may be planarized, e.g., via a CMP process.

Alternatively, FIG. 8E and FIG. 8F show a carrier 212 in a schematic cross-sectional view and a corresponding top view, according to various embodiments (see FIG. 6A to FIG. 6D). In this processing stage, the at least one remanent-polarizable layer 126 is formed over the first electrode structure 124 and the first electrode structure 128 is formed over the at least one remanent-polarizable layer 126. The upper surface may be planarized, e.g., via a CMP process.

According to various embodiments, the first electrode structure 124 may be a floating gate within the memory gate structure, as, for example, illustrated in FIG. 8A to 8F. In this case, the memory cell 100 may be configured so that each memory cell 100 formed in the memory area 200a of the carrier has a separate floating gate associated with the respective memory cell 100. Accordingly, it may be avoided that two or more memory cell 100 that are adjacent to one another share a common floating gate (or in other words a common bottom electrode 124). As illustrated in FIG. 8A and FIG. 8B, the bottom electrode 124 may be patterned after deposition such that memory cells 100 (first in y-direction) do not share the same floating gate. The separation of the floating gate for memory cells 100 in x-direction may be achieved when the stack is planarized (e.g., polished via CMP) in one of the succeeding process steps as illustrated, for example, in FIG. 8C and FIG. 8D. According to various embodiments, the width $W_{BE}$ of the bottom electrode 124 may be as close as possible to the width $W_{act}$ of the active regions 212a in order to reduce the FeCap capacitor area to a minimum while at the same time span across the whole channel width of the memory cell 100.

Alternatively, the bottom electrodes 124 of individual memory cells 100 may be separated from each other by defining the memory cells 100 in y-direction as individual transistors not sharing the same gate terminal, as illustrated in FIG. 8E and FIG. 8F. In this case, the floating gates 124 may be separated from each other by way of the gate stack patterning in both x- and y-direction. However, a predefined spacing $L_{crit}$ between neighboring memory cell 100 is provided. Further, according to various embodiments, the contact 828c to the gate 128g may be made above the STI 240 and not above the active region 212a.

According to various embodiments, the integration flow to provide the capacitive voltage divider 106 between the FeCap (C2) and the remaining MIS layer stack (C1) is in favor of memory cell 100 performance, e.g., a higher relative voltage drop may be achieved across the FeCap (C2) than across the remaining MIS layer stack (C1).

According to various embodiments, the control over the capacitive voltage divider 106 of the memory cell 100, as described above, may be illustrated in more detail below.

Figure 9A:
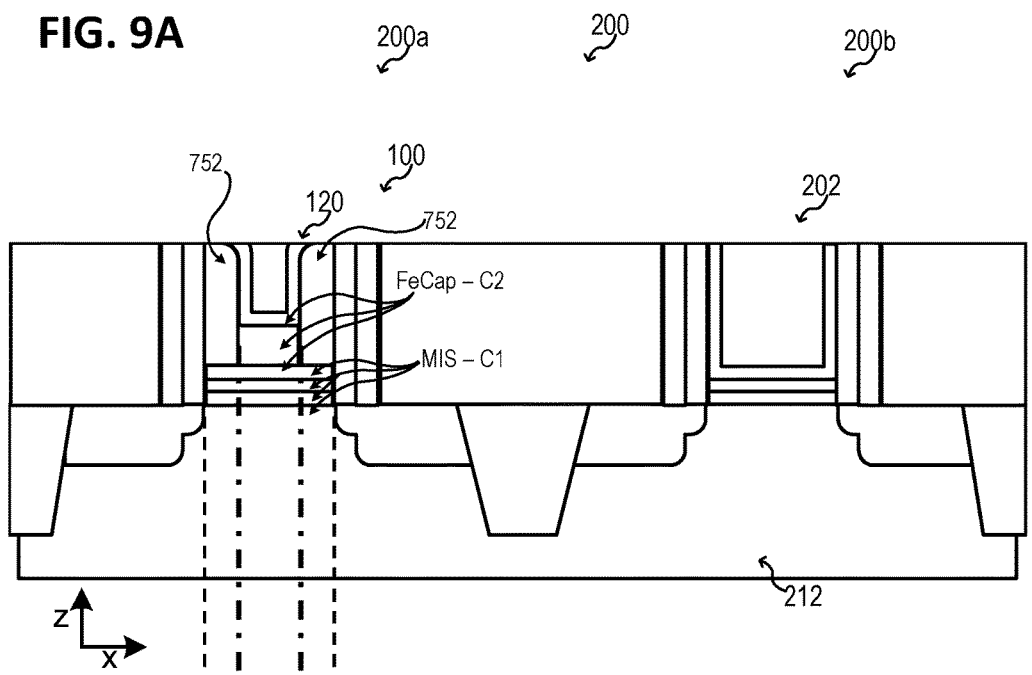
FIG. 9A to FIG. 9D show various memory cells or various electronic devices in a schematic cross-sectional view and a corresponding top view, according to various embodiments.
Figure 9B:
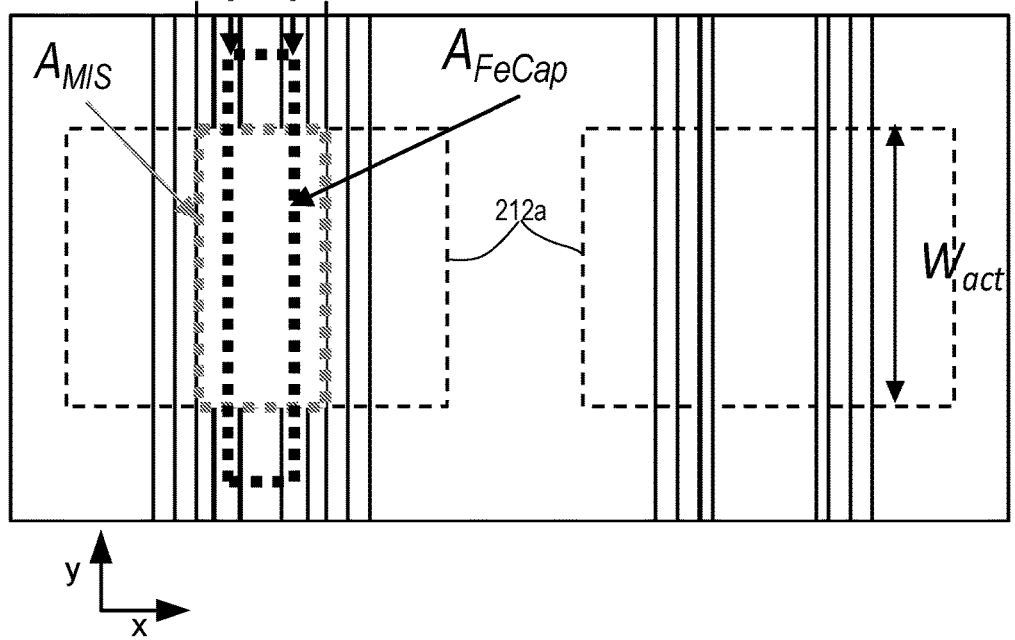
Figure 9C:
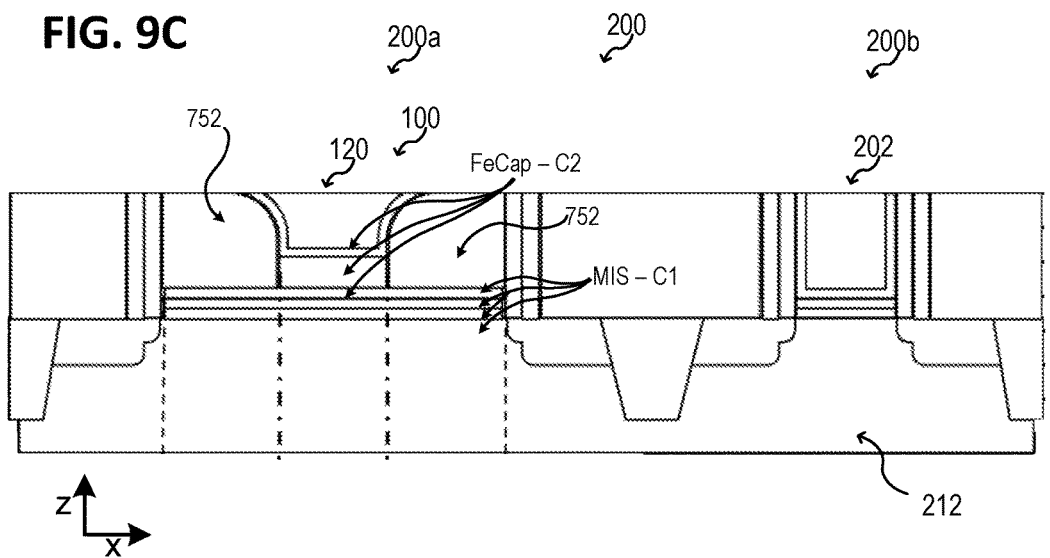
Figure 9D:
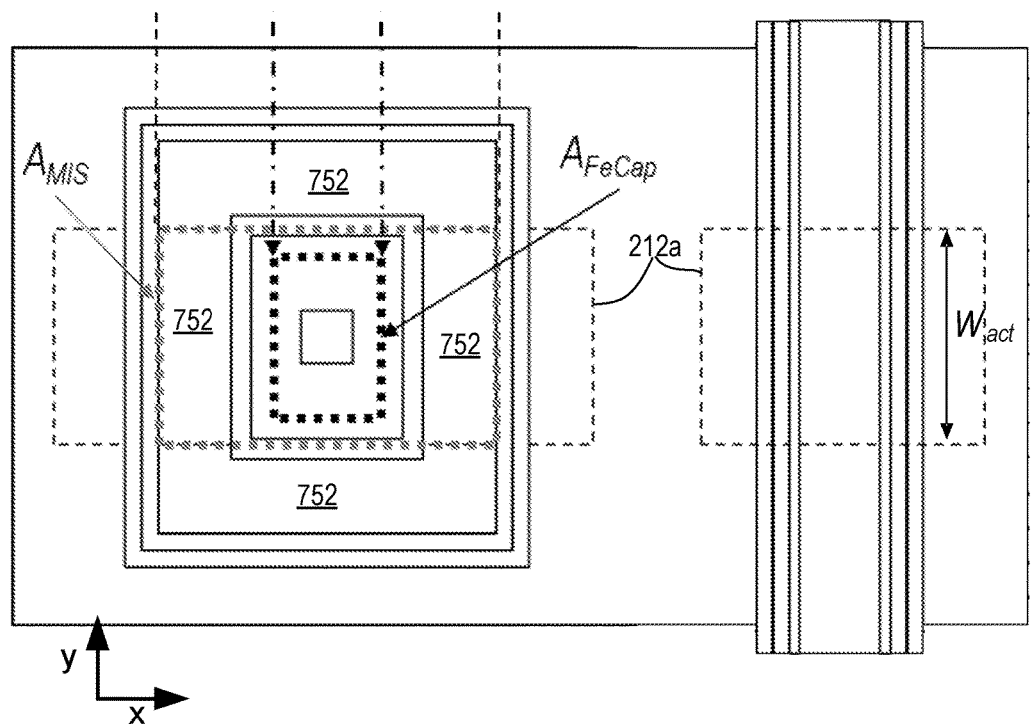

FIG. 9A and FIG. 9B as well as FIG. 9C and FIG. 9D show a carrier 212 in schematic cross-sectional views and a corresponding top views, according to various embodiments. The memory cell 100 may include the same or a similar memory gate structure 120 as illustrated, for example, in FIG. 7G and FIG. 7H. As described above, the channel region 112c (e.g., the active area 212a), the gate isolation structure 122 and the first electrode structure 124 (referred to herein as floating gate) may form a second capacitor structure C2 of a capacitive voltage divider 106 and the at least one remanent-polarizable layer 126 together with the adjacent electrode structures 124, 128t (referred to herein as bottom and top electrode, wherein the bottom electrode is the floating gate) may form a second capacitor structure C2, referred to herein as ferroelectric capacitor (FeCap).

FIG. 9B shows the projected area $A_{FeCap}$ of the FeCap (C2) and the projected area $A_{MIS}$ of the MIS layer stack (C1). Even though the width of the projected area $A_{FeCap}$ of the FeCap may be smaller than the width of the projected area $A_{MIS}$ of the MIS layer stack the in x-direction, the overall projected area $A_{FeCap}$ of the FeCap may be, in some cases, similar to the projected area $A_{MIS}$ of the MIS layer stack due to the overlap of the bottom electrode 124 into the STI area (effectively, the difference of $W_{BE}-W_{act}$ illustrated in FIG. 8B).

Consequently, a sub-lithographic integration scheme (as, for example, illustrated in FIG. 7G and FIG. 7H) may be less effective if it would be implemented in this manner. However, the device geometry may be modified to make the sub-lithographic integration more effective, which is illustrated in FIG. 9C and FIG. 9D. This integration may be similar to the integration illustrated in FIG. 8E and FIG. 8F and may lead to an area ratio ($A_{FeCap}/A_{MIS}$) of less than about 1. Illustratively, the additional spacer 752 (see, for example, FIG. 7G and FIG. 7H) may be used to reduce the lateral dimension of the at least one remanent-polarizable layer 126 and/or the second electrode structure 128 in both the x-direction and the y-direction. However, any other suitable design may be used to limit the lateral dimension of the at least one remanent-polarizable layer 126 and/or the second electrode structure 128 in the y-direction.

Figure 10A:
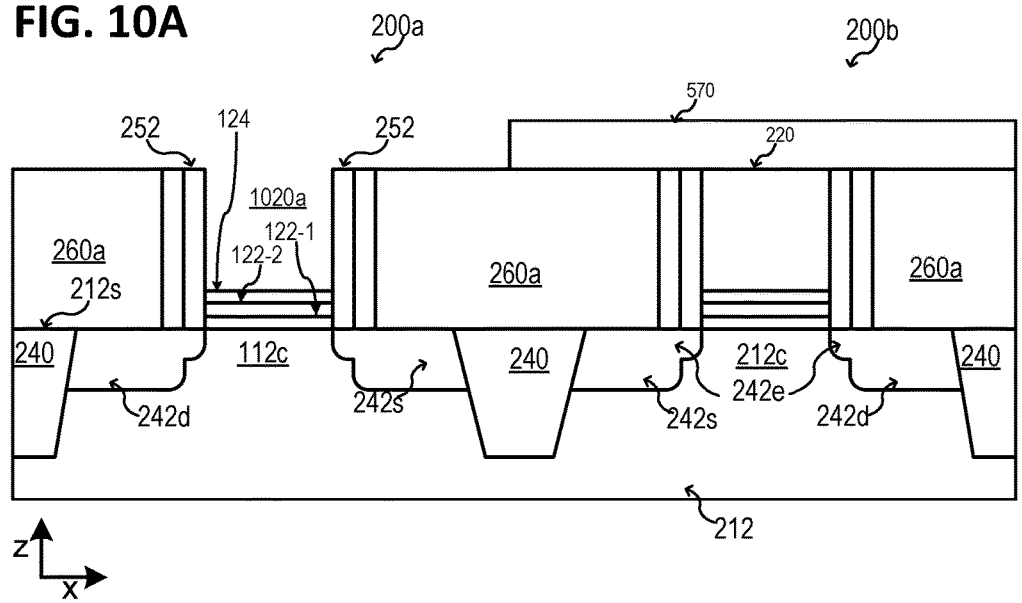
FIG. 10A to FIG. 10G show a carrier during processing a memory cell or an electronic device including a memory cell in a schematic view, according to various embodiments.

In the following, various stages during processing a memory cell 100 or an electronic device 200, e.g., on a carrier 212, are illustrated in more detail. The process flow may be similar to the process flow described above, see, for example, FIG. 5A to FIG. 5D, that may be applied to the sub-lithographic integration of the memory gate structure 120 as described herein, see, for example, FIG. 7F to FIG. 7H, and FIG. 9A to FIG. 9D. The carrier 212 as illustrated in FIG. 5B may be a starting point for the processing described in the following, with the modification, that a first electrode structure 124 is disposed over the gate isolation structure 122, as illustrated in FIG. 10A in a schematic cross-sectional view.

Figure 10B:
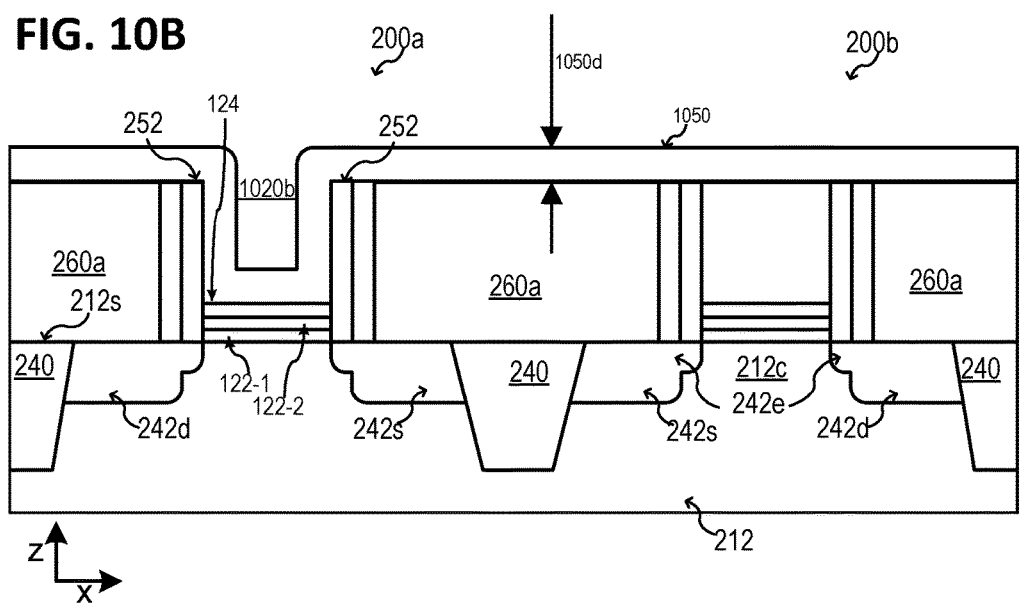

FIG. 10B shows the carrier 212 in a schematic cross-sectional view at a further processing stage, according to various embodiments. The opening 1020a between the support structure 252 (e.g., between the one or more spacer structures) in the memory area 200a may be partially filled with an electrically insulating layer 1050. The electrically insulating layer 1050 may be deposited conformally to cover an upper surface of the gate isolation structure 122 and the sidewalls of the support structure 252 (e.g., the one or more spacer structures). An opening 1020b may remain between two sections of the electrically insulating layer 1050. This remaining opening 1020b may have a lateral dimension, e.g., at least in x-direction, that is less than the lateral dimension of the initial opening 1020a. Further, the remaining opening 1020b may have a lateral dimension, e.g., at least in x-direction, that is less than the lateral dimension of the channel region 112c. Further, the remaining opening 1020b may have a lateral dimension, e.g., at least in x-direction, that is less than the lateral dimension of the gate isolation structure 122. Further, the remaining opening 1020b may have a lateral dimension, e.g., at least in x-direction, that is less than the lateral dimension of the first electrode structure 124. The lateral dimension of the remaining opening 1020b in x-direction may be controlled by the thickness 1050d of the electrically insulating layer 1050. The electrically insulating layer 1050 may include, for example, SiN, SiO$_2$, etc.

According to various embodiments, the initial opening 1020a may be formed via one or more lithographic processes that are close to the lithographic limit. In this case, the lateral dimension of the remaining opening 1020b may have a lateral dimension that is approximately two times the thickness 1050d of the electrically insulating layer 1050 less. Accordingly, this allows for producing an opening 1020b below the lithographic limit that may be used to form the memory gate structure 120.

Figure 10C:
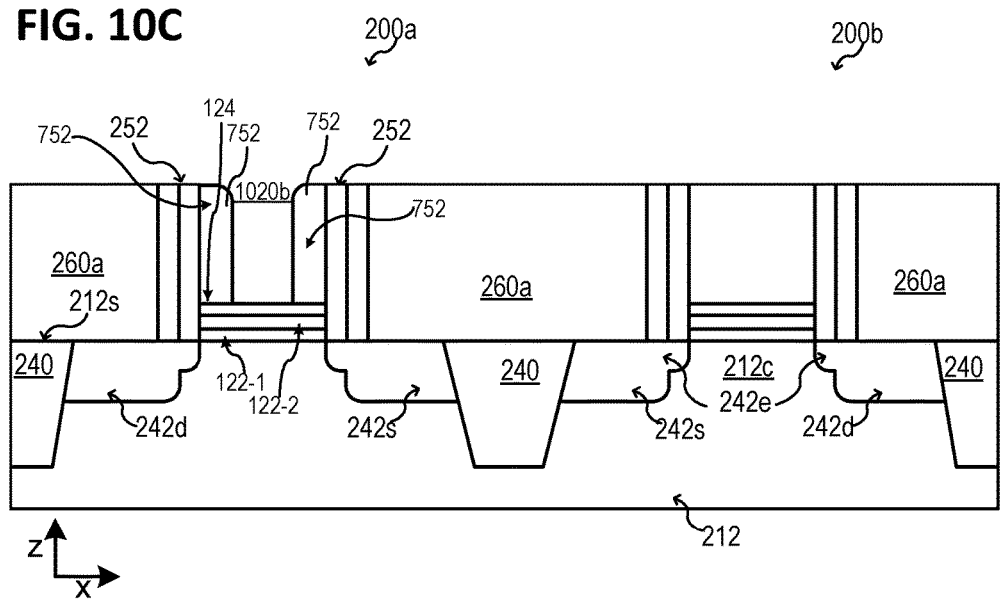

According to various embodiments, the electrically insulating layer 1050 may be partially removed, e.g., etched back via reactive-ion-etching, to partially expose an upper surface of the first electrode structure 124, as illustrated in FIG. 10C in a schematic cross-sectional view. Therefore, an additional support structure 752, e.g., an additional spacer 752 is formed, as described above.

Subsequently, the at least one remanent-polarizable layer 126 and the second electrode structure 128 may be formed within the remaining opening 1020b accordingly to provide the memory gate structure 120 as desired, as, for example, illustrated in FIG. 10D to FIG. 10G in various schematic cross-sectional views.

Figure 10D:
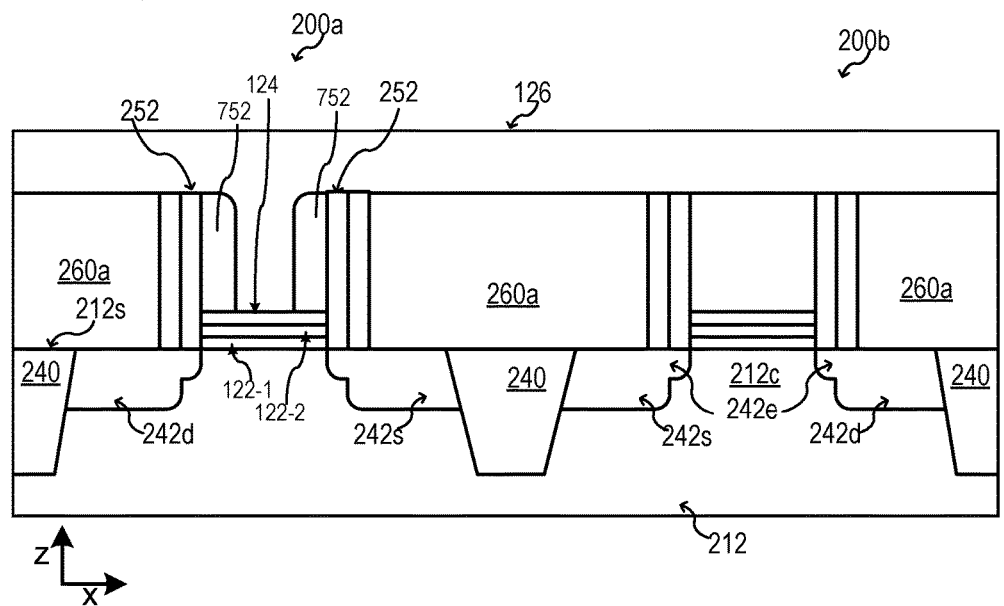

As illustrated in FIG. 10D, the at least one remanent-polarizable layer 126, e.g., a ferroelectric hafnium oxide layer, may be formed, e.g., via atomic layer deposition (ALD) or any other chemical vapor deposition (CVD) or physical vapor deposition (PVD).

Figure 10E:
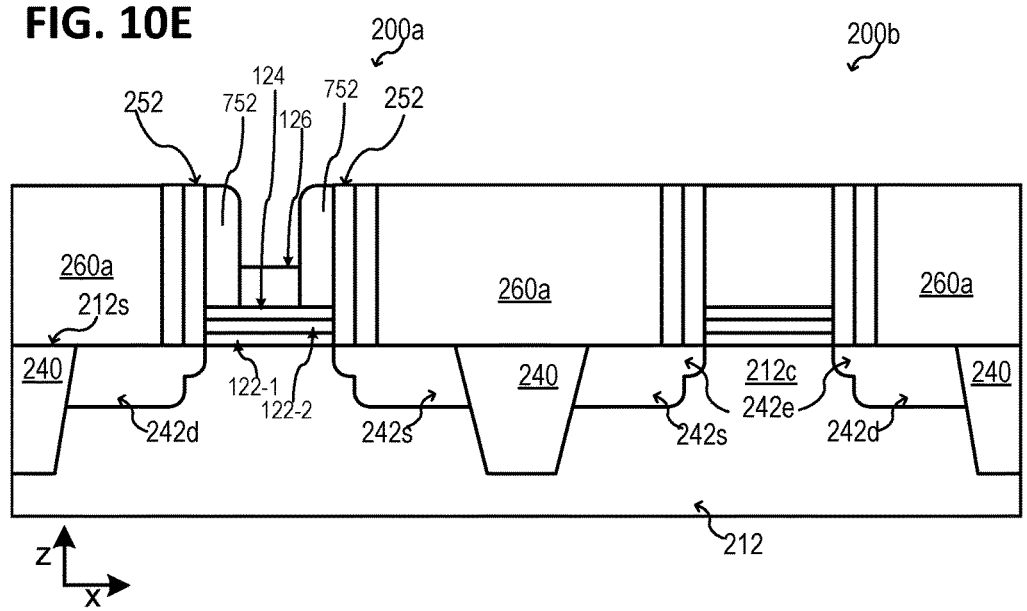

As illustrated in FIG. 10E, the at least one remanent-polarizable layer 126 may be planarized and removed, wherein a portion of the at least one remanent-polarizable layer 126 remains in the opening 1020b. As an example, the remaining opening 1020b may be partially filled with ferroelectric material. Therefore, CMP, wet chemical etching, dry chemical etching, or a combination of these processes may be used. According to various embodiments, a desired thickness for the portion of the at least one remanent-polarizable layer 126 that remains in the opening 1020b may be controlled by etching, e.g., reactive ion etching.

Figure 10F:
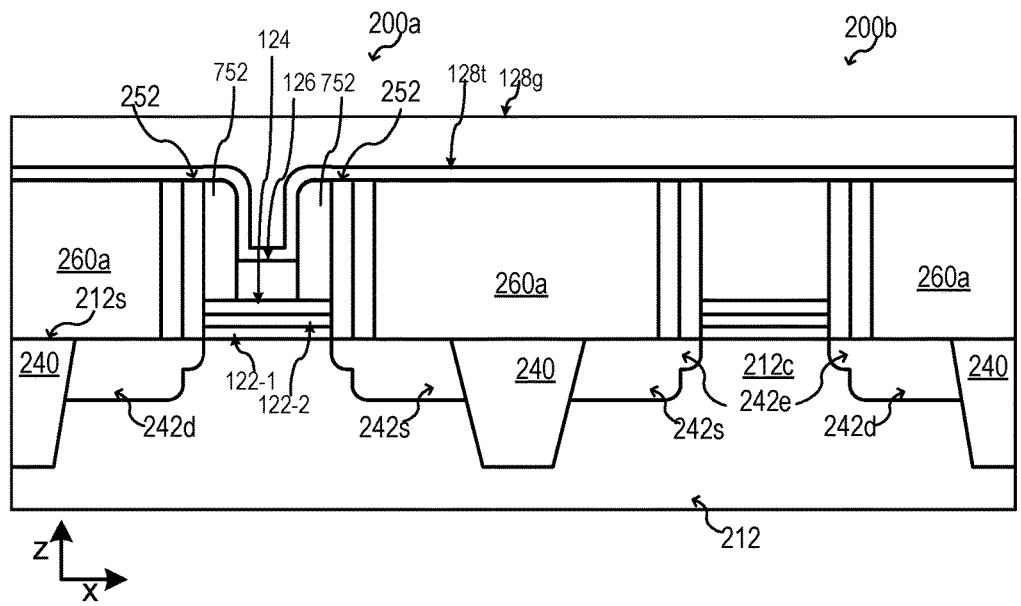

Subsequently, as illustrated in FIG. 10F, the second electrode structure 128, e.g., a top electrode 128t may be deposited, e.g., via ALD, and, subsequently, a gate material 128g, e.g. aluminum, may be deposited. However, a single electrode layer may be used in a similar way, if desired.

Figure 10G:
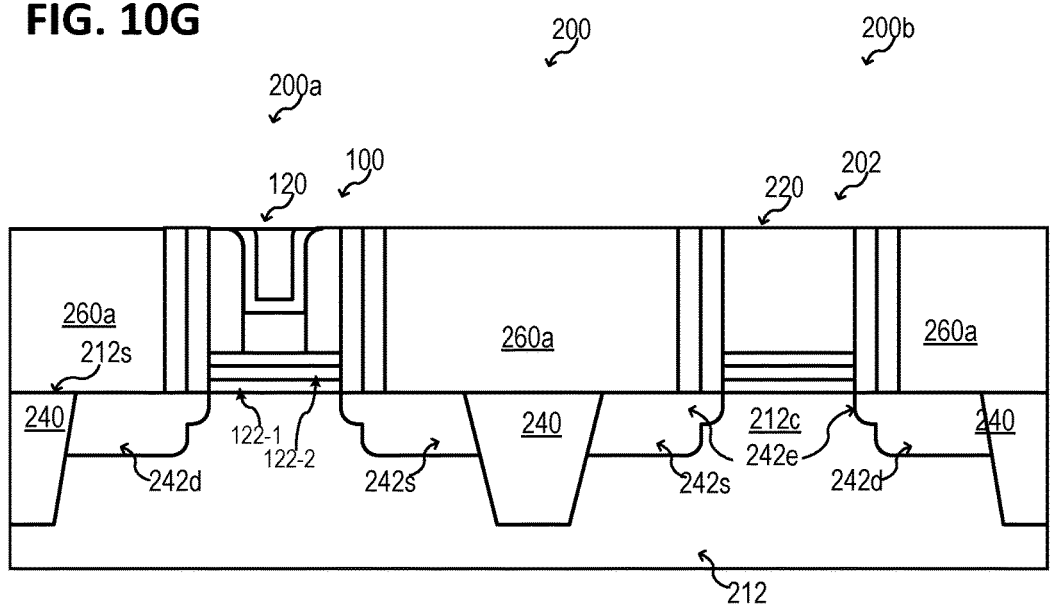

Further, as illustrated in FIG. 10G, a planarization may be carried out to partially remove the top electrode 128t and gate material 128g, e.g., from areas in between the field-effect transistor 202 and the memory cell 100 such that the desired topography is revealed. Therefore, a memory cell 100 may be provided in the memory area 200a of the carrier 212, as described above, see, for example, FIG. 7G.

According to various embodiments, the process flow described above may be modified to form the memory gate structure 120 as illustrated in FIG. 7H. In this case, the at least one remanent-polarizable layer 126 may be formed before the additional support structure 752 (e.g., the additional spacer) is formed in the opening 1020a. Therefore, the lateral dimension of the second electrode structure 128 may be reduced due to the additional support structure 752, as described above.

According to various embodiments, sub-lithographic features may be used that form at least part of the memory gate structure 120 of the memory cell 100. As an example, sub-lithographic features are used for creating an insulating memory layer 126, whereas the insulator may include ferroelectric HfO$_2$, which has a lateral dimension (e.g., at least in the x-direction or in both the x- and the y-direction) that may be below the lithographic limit. Since the capacitor is connected in series to the capacitance of the layer stack underneath, a voltage applied to the top electrode of the capacitor is divided according to the capacitive voltage divider of the whole stack. The capacitance is directly influenced by the capacitor area (the smaller the area, the smaller the capacitance), and the relative voltage drop across the ferroelectric capacitor is increased when its capacitance is decreased relative to the remaining capacitance that is connected in series to the ferroelectric capacitor. Accordingly, the integration of the potentially sub-lithographic capacitor may lead to an overall reduction in the required write voltage, improved endurance characteristics and improved retention properties of the memory cell 100.

According to various embodiments, the at least one remanent-polarizable layer 126 may be decrease in the area and the volume such that the at least one remanent-polarizable layer 126 may consist of only one grain and, therefore, the film may be in principle in a monocrystalline state, which may reduce the variation of the electronic properties from device to device.

Further, by decreasing the volume of a ferroelectric material (that forms the at least one remanent-polarizable layer 126) may allow to stabilize the ferroelectric crystal phase which may help improving the memory cell 100 performance.

After the memory cell 100 is readily processed, the field-effect transistor 202 in the logic area 200b may be finalized, as described above (see, for example, FIG. 2A to 4D).

Various embodiments may be related to the use of dummy structures. A dummy structure may be a structure that is used during processing as a space holder for a structure formed at a subsequent processing stage. The dummy structure may be replaced by any desired structure during processing. As an example, the dummy structure may be removed to form an opening with a desired shape and size, wherein this opening is utilized for further processes.

Figure 11:
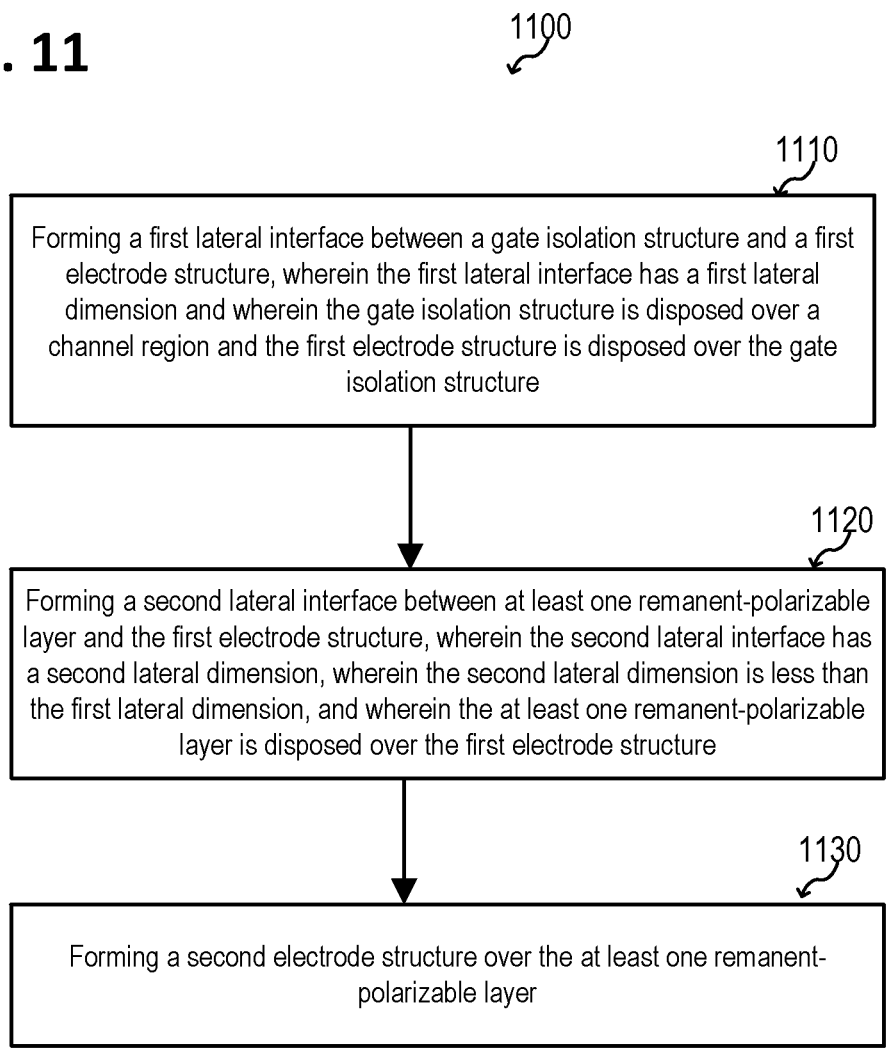
FIG. 11 shows a schematic flow diagram of a method for processing a memory cell, according to various embodiments.

FIG. 11 illustrates a schematic flow diagram of a method 1100 for processing a memory cell 100, according to various embodiments. The method 1100 may include: in 1110, forming a first lateral interface between a gate isolation structure and a first electrode structure, wherein the first lateral interface has a first lateral dimension and wherein the gate isolation structure is disposed over a channel region and the first electrode structure is disposed over the gate isolation structure; in 1120, forming a second lateral interface between at least one remanent-polarizable layer and the first electrode structure, wherein the second lateral interface has a second lateral dimension, wherein the second lateral dimension is less than the first lateral dimension, and wherein the at least one remanent-polarizable layer is disposed over the first electrode structure; and, in 1130, forming a second electrode structure over the at least one remanent-polarizable layer. According to various embodiments, the method 1100 may be carried out as described above with reference to the processing of the carrier 212, or in other words, to the manufacturing of the memory cell 100 and/or the logic field-effect transistor 202.

FIG. 12 illustrates a schematic flow diagram of a method 1200 for processing a memory cell 100, according to various embodiments. The method 1200 may include: in 1210, forming a field-effect transistor structure, the field-effect transistor structure including a gate isolation structure, a dummy gate structure disposed over the gate isolation structure, and a support structure laterally surrounding the dummy gate structure; in 1220, forming an opening by removing the dummy gate structure, the opening exposing at least one sidewall of the support structure and an upper surface of the gate isolation structure; and, in 1230, forming a memory structure in the opening, the memory structure including a first electrode structure, a second electrode structure, and at least one remanent-polarizable layer disposed between the first electrode structure and the second electrode structure. According to various embodiments, the method 1200 may be carried out as described above with reference to the processing of the carrier 212, or in other words, to the manufacturing of the memory cell 100 and/or the logic field-effect transistor 202.

In the following, various examples are provided that may refer to one or more embodiments described herein.

Example 1 is a memory cell, including: a channel region; a gate isolation structure disposed over the channel region; a first electrode structure disposed over the gate isolation structure; at least one remanent-polarizable layer disposed over the first electrode structure; a second electrode structure disposed over the at least one remanent-polarizable layer; wherein a first lateral interface between the gate isolation structure and the first electrode structure has a first lateral dimension; and wherein a second lateral interface between the at least one remanent-polarizable layer and the first electrode structure has a second lateral dimension, wherein the second lateral dimension is less than the first lateral dimension. In other words, a memory cell may include: a channel region; a gate isolation structure disposed over the channel region; a first electrode structure disposed over the gate isolation structure; at least one remanent-polarizable layer disposed over the first electrode structure; a second electrode structure disposed over the at least one remanent-polarizable layer; wherein the gate isolation structure and the first electrode structure form a first lateral interface, wherein the first electrode structure and the at least one remanent-polarizable layer form a second lateral interface, and wherein a lateral dimension of the first lateral interface is greater than a lateral dimension of the second lateral interface. In other words, a memory cell may include: a channel region; a gate isolation structure disposed over the channel region; a first electrode structure disposed over the gate isolation structure; at least one remanent-polarizable layer disposed over the first electrode structure; a second electrode structure disposed over the at least one remanent-polarizable layer; wherein a first lateral interface of the gate isolation structure with the first electrode structure has a first lateral dimension; and wherein a second lateral interface of the at least one remanent-polarizable layer with the first electrode structure has a second lateral dimension, wherein the second lateral dimension is less than the first lateral dimension. According to various embodiments, a ratio of the lateral dimension of the second lateral interface to the lateral dimension of the first lateral interface may be less than about 0.9, e.g., in the range from about 0.01 to about 0.9, e.g., in the range from about 0.1 to about 0.9, e.g., in the range from about 0.1 to about 0.6. According to various embodiments, a lateral dimension may be a width or a diameter of the respective structure.

In Example 2, the memory cell of example 1 may further include that a third lateral interface between the gate isolation structure and the channel region has a third lateral dimension greater than the second lateral dimension.

In Example 3, the memory cell of example 2 may further include that the third lateral dimension is substantially equal to the first lateral dimension.

In Example 4, the memory cell of examples 1 to 3 may further include that a fourth lateral interface between the at least one remanent-polarizable layer and the second electrode structure has a fourth lateral dimension less than the first lateral dimension.

In Example 5, the memory cell of example 4 may further include that the fourth lateral dimension is substantially equal to the second lateral dimension.

In Example 6, the memory cell of examples 1 to 5 may further include at least one electrically insulating portion disposed over the first electrode structure and laterally surrounding the second electrode structure or laterally surrounding both the second electrode structure and the at least one remanent-polarizable layer.

In Example 7, the memory cell of example 6 may further include that the at least one electrically insulating portion is disposed over the at least one remanent-polarizable layer and laterally surrounds the second electrode structure.

In Example 8, the memory cell of example 6 or 7 may further include that the second electrode structure covers a sidewall of the at least one electrically insulating portion at least partially.

In Example 9, the memory cell of examples 1 to 8 may further include at least one electrically insulating portion laterally surrounding the first electrode structure.

In Example 10, the memory cell of example 9 may further include that the at least one electrically insulating portion includes a sidewall facing the first electrode structure and, that the first electrode structure covers the sidewall of the at least one electrically insulating portion at least partially.

In Example 11, the memory cell of example 9 or 10 may further include that the first electrode structure has a concave shape (e.g., having one or more angled sections and/or one or more arcuated sections).

In Example 12, the memory cell of examples 9 to 11 may further include that the at least one remanent-polarizable layer has a concave shape (e.g., having one or more angled sections and/or one or more arcuated sections).

In Example 13, the memory cell of example 12 may further include that the second electrode structure is disposed between at least two sections of the at least one remanent-polarizable layer.

In Example 14, the memory cell of examples 1 to 13 may further include that the first electrode structure has a first width and that the second electrode structure has a second width, wherein the second width is less than the first width.

In Example 15, the memory cell of examples 1 to 14 may further include that a width of the first electrode structure is greater than a width of the at least one remanent-polarizable layer.

In Example 16, the memory cell of examples 1 to 15 may further include a semiconductor portion and at least a first source/drain region and a second source/drain region disposed in the semiconductor portion; wherein the channel region extends in the semiconductor portion from the first source/drain region to the second source/drain region.

In Example 17, the memory cell of examples 1 to 16 may further include that the channel region, the gate isolation structure, the first electrode structure, the at least one remanent-polarizable layer, and the second electrode structure form a field-effect transistor structure and a memory structure with the first electrode structure configured as a floating gate and the second electrode structure configured as a gate.

In Example 18, the memory cell of example 17 may further include that the first electrode structure, the at least one remanent-polarizable layer, and the second electrode structure form a memory structure.

In Example 19, the memory cell of examples 1 to 18 may further include one or more metallization structures configured to electrically contact the second electrode structure.

In Example 20, the memory cell of example 19 may further include that the one or more metallization structures include a contact metallization and a single- or multilevel metallization disposed over the contact metallization; that both the contact metallization and at least one level of the single- or multilevel metallization are disposed over the second electrode structure.

In Example 21, the memory cell of examples 1 to 20 may further include that the at least one remanent-polarizable layer includes at least one ferroelectric material.

In Example 22, the memory cell of examples 1 to 21 may further include that the gate isolation structure includes a first layer of a first electrically insulating material and a second layer of a second electrically insulating material, that the second electrically insulating material is a high-k material.

In Example 23, the memory cell of examples 1 to 22 may further include that the first electrode structure, the gate isolation structure, and the channel region forming a first capacitor structure defining a capacitor area of a first size; and that the first electrode structure, the at least one remanent-polarizable layer, and the second electrode structure forming a second capacitor structure defining a capacitor area of a second size, wherein the second size is less than the first size.

In Example 24, the memory cell of example 23 may further include that a ratio of the second size to the first size is less than 0.9, e.g., in the range from about 0.01 to about 0.9, e.g., in the range from about 0.1 to about 0.9, e.g., in the range from about 0.1 to about 0.6.

In Example 25, the memory cell of example 23 or 24 may further include that the first capacitor area is defined by a projection of the first electrode structure to the channel region; and that the second capacitor area is defined by a projection of the second electrode structure to the first electrode structure.

Example 26 is a memory cell, including: a field-effect transistor structure including a channel region, a gate isolation structure disposed at the channel region, and a memory structure disposed over the gate isolation structure, the memory structure including: a first electrode structure, a second electrode structure, and at least one remanent-polarizable layer disposed between the first electrode structure and the second electrode structure.

In Example 27, the memory cell of example 26 may further include that the first electrode structure is a floating gate of the field-effect transistor structure and that the second electrode structure is a gate of the field-effect transistor structure.

In Example 28, the memory cell of example 26 or 27 may further include that a first lateral interface between the gate isolation structure and the first electrode structure has a first lateral dimension; and that a second lateral interface between the at least one remanent-polarizable layer and the first electrode structure has a second lateral dimension, wherein the second lateral dimension is less than the first lateral dimension.

In Example 29, the memory cell of examples 26 to 28 may further include that the first electrode structure, the gate isolation structure, and the channel region forming a first capacitor structure defining a capacitor area of a first size; and that the first electrode structure, the at least one remanent-polarizable layer, and the second electrode structure forming a second capacitor structure defining a capacitor area of a second size, wherein the second size is less than the first size.

In Example 30, the memory cell of example 29 may further include that a ratio of the second size to the first size is less than 0.9, e.g., in the range from about 0.01 to about 0.9, e.g., in the range from about 0.1 to about 0.9, e.g., in the range from about 0.1 to about 0.6.

In Example 31, the memory cell of example 29 or 30 may further include that the first capacitor area is defined by a projection (e.g., an orthogonal projection) of the first electrode structure to the channel region; and that the second capacitor area is defined by a projection (e.g., an orthogonal projection) of the second electrode structure to the first electrode structure.

Example 32 is a method for processing a memory cell, the method including: forming a first lateral interface between a gate isolation structure and a first electrode structure, wherein the first lateral interface has a first lateral dimension and wherein the gate isolation structure is disposed over a channel region and the first electrode structure is disposed over the gate isolation structure; forming a second lateral interface between at least one remanent-polarizable layer and the first electrode structure, wherein the second lateral interface has a second lateral dimension, wherein the second lateral dimension is less than the first lateral dimension, and wherein the at least one remanent-polarizable layer is disposed over the first electrode structure; and forming a second electrode structure over the at least one remanent-polarizable layer.

Example 33 is a method for processing a memory cell, the method including: forming a dummy structure over a carrier, forming a support structure laterally surrounding the dummy structure; forming an opening by removing the dummy structure, the opening exposing at least one sidewall of the support structure; and forming a memory structure in the opening, the memory structure including a first electrode structure, a second electrode structure, and at least one remanent-polarizable layer disposed between the first electrode structure and the second electrode structure.

Example 34 is a method for processing a memory cell, the method including: forming a dummy structure over a carrier, forming a support structure laterally surrounding the dummy structure; forming an opening by removing the dummy structure, the opening exposing at least one sidewall of the support structure; and forming a memory structure in the opening, the memory structure including at least one remanent-polarizable layer and an electrode structure disposed over the at least one remanent-polarizable layer.

Example 35 is a method for processing a memory cell, the method including: forming a gate isolation structure over a channel region of a carrier; forming a gate electrode structure over the gate isolation structure; forming a support structure laterally surrounding at least the gate electrode structure; forming an opening by partially removing the gate electrode structure, the opening exposing at least one sidewall of the support structure and a surface region of a remaining portion of the gate electrode structure; and forming a memory structure in the opening, the memory structure including at least one remanent-polarizable layer disposed over the remaining portion of the gate electrode structure and an electrode structure disposed over the at least one remanent-polarizable layer. Further, the remaining portion of the gate electrode structure may be configured as a floating gate.

Example 36 is a method for processing a memory cell, the method including: forming a gate isolation structure over a channel region of a carrier; forming a gate electrode structure over the gate isolation structure; forming a support structure laterally surrounding the gate electrode structure; forming an opening by completely removing the gate electrode structure, the opening exposing at least one sidewall of the support structure and a surface region of the gate isolation structure; and forming a memory structure in the opening, the memory structure including a first electrode structure disposed over the surface region of the gate isolation structure, at least one remanent-polarizable layer disposed over the first electrode structure, and a second electrode structure disposed over the at least one remanent-polarizable layer. Further, the first electrode structure may be configured as a floating gate.

Example 37 is a method for processing a memory cell, the method including: forming a gate isolation structure over a channel region of a carrier; forming a gate electrode structure over the gate isolation structure; forming a support structure laterally surrounding the gate electrode structure and the gate isolation structure; forming an opening by completely removing the gate electrode structure and partially removing the gate isolation structure, the opening exposing at least one sidewall of the support structure and a surface region of a remaining portion of the gate isolation structure; and forming a memory structure in the opening, the memory structure including at least one remanent-polarizable layer disposed over the remaining portion of the gate isolation structure and an electrode structure disposed over the at least one remanent-polarizable layer.

Example 38 is a method for processing a memory cell, the method including: forming a gate isolation structure over a channel region of a carrier; forming a gate electrode structure over the gate isolation structure; forming a support structure laterally surrounding the gate electrode structure and the gate isolation structure; forming an opening by completely removing the gate electrode structure and partially removing the gate isolation structure, the opening exposing at least one sidewall of the support structure and a surface of the channel region; and forming a memory structure in the opening, the memory structure including at least one remanent-polarizable layer disposed over the channel region and an electrode structure disposed over the at least one remanent-polarizable layer.

Example 39 is a method for processing a memory cell, the method including: forming a field-effect transistor structure, the field-effect transistor structure including a gate isolation structure, a dummy gate structure disposed over the gate isolation structure, and a support structure laterally surrounding the dummy gate structure; forming an opening by removing the dummy gate structure, the opening exposing at least one sidewall of the support structure and an upper surface of the gate isolation structure; and forming a memory structure in the opening, the memory structure including a first electrode structure, a second electrode structure, and at least one remanent-polarizable layer disposed between the first electrode structure and the second electrode structure.

In Example 40, the method of example 39 may further include that forming the memory structure includes: forming the first electrode structure, the first electrode structure extending along the at least one sidewall of the support structure and the upper surface of the gate isolation structure; forming the at least one remanent-polarizable layer, the at least one remanent-polarizable layer being disposed over the first electrode structure; and forming the second electrode structure, the second electrode structure being disposed over the at least one remanent-polarizable layer.

In Example 41, the method of example 39 may further include that forming the memory structure includes: forming the first electrode structure, the first electrode structure covering the upper surface of the gate isolation structure; forming a spacer structure, the spacer structure covering the at least one sidewall of the support structure; forming the at least one remanent-polarizable layer, the at least one remanent-polarizable layer covering the first electrode structure and being laterally surrounded by the spacer structure; and forming the second electrode structure, the second electrode structure covering the at least one remanent-polarizable layer and being laterally surrounded by the spacer structure.

In Example 42, the method of example 39 may further include that forming the memory structure includes: forming the first electrode structure, the first electrode structure covering the upper surface of the gate isolation structure; forming the at least one remanent-polarizable layer, the at least one remanent-polarizable layer covering the first electrode structure; forming a spacer structure, the spacer structure covering the at least one sidewall of the support structure; and forming the second electrode structure, the second electrode structure covering the at least one remanent-polarizable layer and being laterally surrounded by the spacer structure.

Example 43 is a method for processing a memory cell, the method including: forming a field-effect transistor structure, the field-effect transistor structure including: a gate isolation structure; a dummy gate structure disposed over the gate isolation structure; and a support structure laterally surrounding the dummy gate structure; forming an opening by removing the dummy gate structure, the opening exposing at least one sidewall of the support structure and an upper surface of the gate isolation structure; and forming a memory structure in the opening, the memory structure including at least one remanent-polarizable layer.

Example 44 is a memory cell, including: a channel region; a gate isolation structure disposed over the channel region; a first electrode structure disposed over the gate isolation structure; at least one remanent-polarizable layer disposed over the first electrode structure; a second electrode structure disposed over the at least one remanent-polarizable layer; wherein the first electrode structure, the gate isolation structure, and the channel region form a first capacitor structure defining a capacitor area of a first size; and wherein the first electrode structure, the at least one remanent-polarizable layer, and the second electrode structure form a second capacitor structure defining a capacitor area of a second size, wherein the second size is less than the first size. According to various embodiments, a memory cell may include: a channel region; a gate isolation structure disposed over the channel region; a first electrode structure disposed over the gate isolation structure; at least one remanent-polarizable layer disposed over the first electrode structure; a second electrode structure disposed over the at least one remanent-polarizable layer; wherein the first electrode structure, the gate isolation structure, and the channel region form a first capacitor structure defining a lateral capacitor area of a first size; and wherein the first electrode structure, the at least one remanent-polarizable layer, and the second electrode structure form a second capacitor structure defining a lateral capacitor area of a second size, wherein the second size is less than the first size.

Example 45 is an electronic device, including: a carrier including a memory area and a logic area; one or more memory cells of any one of the Examples 1 to 31 and 44 disposed in the memory area; and one or more logic field-effect transistors disposed in the logic area.

Example 46 is an electronic device, including: a carrier including a memory area and a logic area; a first channel region disposed in the memory area and a second channel region disposed in the logic area; a memory gate structure disposed at the first channel region, the memory gate structure including: a gate isolation structure disposed over the first channel region, a floating gate electrode structure disposed over the gate isolation structure, at least one remanent-polarizable layer disposed over the floating gate electrode structure, and a gate electrode structure disposed over the at least one remanent-polarizable layer; and a logic gate structure disposed at the second channel region, the logic gate structure including: a gate isolation structure disposed over the second channel region, and a gate electrode structure disposed over the gate isolation structure.

In Example 47, the electronic device of example 46 may further include that the gate isolation structure of the logic gate structure is formed in the same deposition process as the gate isolation structure of the memory gate structure.

In Example 48, the electronic device of example 46 or 47 may further include that at least a part of the logic gate structure is formed into an opening provided by removing a dummy structure.

In Example 49, the electronic device of example 46 to 48 may further include that at least a part of the memory gate structure is formed into an opening provided by removing a dummy structure.

Example 50 is a memory structure, including: a first electrode structure, at least one remanent-polarizable layer disposed over the first electrode structure, a second electrode structure disposed over the at least one remanent-polarizable layer, a spacer structure disposed at an upper surface of the first electrode structure and laterally surrounding the at least one remanent-polarizable layer and the second electrode structure. Further, a lateral dimension of the second electrode structure may be less than the lateral dimension of the first electrode structure. Further, a lateral dimension of the at least one remanent-polarizable layer may be less than the lateral dimension of the first electrode structure.

Example 51 is a memory structure, including: a first electrode structure, at least one remanent-polarizable layer disposed over the first electrode structure, a second electrode structure disposed over the at least one remanent-polarizable layer, a spacer structure disposed at an upper surface of the at least one remanent-polarizable layer and laterally surrounding the second electrode structure. Further, a lateral dimension of the second electrode structure may be less than the lateral dimension of the first electrode structure. Further, a lateral dimension of the second electrode structure may be less than the lateral dimension of the at least one remanent-polarizable layer. Further, a lateral dimension of the at least one remanent-polarizable layer may be equal to the lateral dimension of the first electrode structure.

Various embodiments may be related to a remanent-polarizable layer or a remanent-polarizable material, however, the term "remanent-polarizable" may be understood in some aspects as "spontaneously-polarizable" and vice versa.

According to various embodiments, the memory cell may include ferroelectric $HfO_2$ that allows the integration of a ferroelectric capacitor structure with a small feature size. As an example, the at least one remanent-polarizable layer may be or may include a ferroelectric $HfO_2$ layer. Therefore, the at least one remanent-polarizable layer 126 may be still ferroelectric at a layer thickness of about 10 nm or less, e.g., in the range from about 2 nm to about 10 nm. Other ferroelectric materials may lose their ferroelectric properties for film thicknesses of around and below 10 nm. This may be relevant, for example, in technology nodes (e.g., ≤28 nm) in which the integrated circuit structures are integrated in smaller and smaller geometries.

According to various embodiments, the at least one remanent-polarizable layer may consist of a monocrystalline portion (e.g., of a single crystal grain) of a remanent-polarizable material. Accordingly, the lateral and vertical dimension of the at least one remanent-polarizable layer may be defined by the lateral and vertical dimension of a single crystal grain of the remanent-polarizable material. The remanent-polarizable material may be a ferroelectric material, e.g., ferroelectric hafnium oxide. However, ferroelectric hafnium oxide may be also referred to as remanent-polarizable hafnium oxide.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell, comprising:
    a channel region;
    a gate isolation structure disposed over the channel region, wherein the gate isolation structure has a planar shape;
    a first electrode structure disposed over the gate isolation structure, wherein the first electrode structure has a concave shape;
    at least one remanent-polarizable layer disposed over the first electrode structure, wherein the at least one remanent-polarizable layer has a concave shape;
    a second electrode structure disposed over the at least one remanent-polarizable layer;
    wherein the gate isolation structure and the first electrode structure form a first lateral interface,
    wherein the first electrode structure and the at least one remanent-polarizable layer form a second lateral interface,
    wherein a lateral dimension of the second lateral interface is less than a lateral dimension of the first lateral interface, and
    wherein a width of the first electrode structure is substantially the same as a width of the gate isolation structure.

2. The memory cell of claim 1,
    wherein the gate isolation structure and the channel region form a third lateral interface,
    wherein a lateral dimension of the third lateral interface is greater than the lateral dimension of the second lateral interface.

3. The memory cell of claim 2,
    wherein the lateral dimension of the third lateral interface is substantially equal to the lateral dimension of the first lateral interface.

4. The memory cell of claim 1,
    wherein the at least one remanent-polarizable layer and the second electrode structure form a fourth lateral interface, wherein a lateral dimension of the fourth lateral interface is less than the lateral dimension of the first lateral interface.

5. The memory cell of claim 4,
    wherein the lateral dimension of the fourth lateral interface is substantially equal to the lateral dimension of the second lateral interface.

6. The memory cell of claim 1, further comprising:
at least one electrically insulating portion disposed over the first electrode structure and laterally surrounding the second electrode structure or laterally surrounding both the second electrode structure and the at least one remanent-polarizable layer.

7. The memory cell of claim 6,
wherein the at least one electrically insulating portion is disposed over the at least one remanent-polarizable layer and laterally surrounds the second electrode structure.

8. The memory cell of claim 6,
wherein the second electrode structure covers a sidewall of the at least one electrically insulating portion at least partially.

9. The memory cell of claim 1, further comprising:
at least one electrically insulating portion laterally surrounding the first electrode structure.

10. The memory cell of claim 9,
wherein the at least one electrically insulating portion comprises a sidewall facing the first electrode structure and, wherein the first electrode structure covers the sidewall of the at least one electrically insulating portion at least partially.

11. The memory cell of claim 9,
wherein the second electrode structure is disposed between at least two sections of the at least one remanent-polarizable layer.

12. The memory cell of claim 1,
wherein a width of the first electrode structure is greater than a width of the second electrode structure.

13. The memory cell of claim 1,
wherein a width of the first electrode structure is greater than a width of the at least one remanent-polarizable layer.

14. The memory cell of claim 1, further comprising:
a semiconductor portion and at least a first source/drain region and a second source/drain region disposed in the semiconductor portion; wherein the channel region extends in the semiconductor portion from the first source/drain region to the second source/drain region.

15. The memory cell of claim 1,
wherein the at least one remanent-polarizable layer comprises at least one ferroelectric material.

16. The memory cell of claim 1, wherein the concave shape is a u-shape.

17. A memory cell, comprising:
a channel region;
a gate isolation structure disposed over the channel region having a first electrically insulating layer and a second electrically insulating layer;
wherein the first electrically insulating layer has a planar shape;
wherein the second electrically insulating layer of the gate isolation structure has a concave shape and is disposed over the first electrically insulating layer;
a first electrode structure disposed over the second electrically insulating layer, wherein the first electrode structure has a concave shape;
at least one remanent-polarizable layer disposed over the first electrode structure, wherein the at least one remanent-polarizable layer has a concave shape;
a second electrode structure disposed over the at least one remanent-polarizable layer;
wherein the first electrically insulating layer and the second electrically insulating layer form a first lateral interface;
wherein the second electrically insulating layer and the first electrode form a second lateral interface;
wherein a lateral dimension of the second lateral interface is less than a lateral dimension of the first lateral interface; and
wherein a width of the second electrically insulating layer is substantially the same as a width of the first electrically insulating layer.

* * * * *